United States Patent
Kodani

(10) Patent No.: US 8,476,754 B2
(45) Date of Patent: Jul. 2, 2013

(54) WIRING SUBSTRATE AND METHOD OF MANUFACTURING THE SAME

(75) Inventor: Kotaro Kodani, Nagano (JP)

(73) Assignee: Shinko Electric Industries Co., Ltd., Nagano-Shi (JP)

( * ) Notice: Subject to any disclaimer, the term of this patent is extended or adjusted under 35 U.S.C. 154(b) by 161 days.

(21) Appl. No.: 12/792,096

(22) Filed: Jun. 2, 2010

(65) Prior Publication Data

US 2010/0308451 A1    Dec. 9, 2010

(30) Foreign Application Priority Data

Jun. 3, 2009   (JP) ................. 2009-133604

(51) Int. Cl.
*H01L 23/48*   (2006.01)
*H01L 23/12*   (2006.01)
*H01L 29/40*   (2006.01)

(52) U.S. Cl.
USPC ........... 257/690; 257/704; 257/773; 257/775; 257/737; 17/261

(58) Field of Classification Search
USPC .............. 257/685–786, E23.069, E23.181; 174/250–268; 205/125; 361/748–777
See application file for complete search history.

(56) References Cited

U.S. PATENT DOCUMENTS

| | | | |
|---|---|---|---|
| 6,747,350 B1 * | 6/2004 | Lin et al. | 257/704 |
| 2001/0008301 A1 * | 7/2001 | Terui | 257/659 |
| 2005/0039948 A1 * | 2/2005 | Asai et al. | 174/262 |
| 2006/0102384 A1 * | 5/2006 | Watanabe et al. | 174/256 |
| 2009/0315172 A1 * | 12/2009 | Lim et al. | 257/712 |
| 2010/0133705 A1 * | 6/2010 | Fillion et al. | 257/782 |

FOREIGN PATENT DOCUMENTS

| | | |
|---|---|---|
| JP | 2002-198462 | 7/2002 |
| JP | 2005-327780 | 11/2005 |
| JP | 2007-013092 | 1/2007 |

* cited by examiner

*Primary Examiner* — Asok K Sarkar
*Assistant Examiner* — Dmitriy Yemelyanov
(74) *Attorney, Agent, or Firm* — Rankin, Hill & Clark LLP

(57) ABSTRACT

There is provided a wiring substrate. The wiring substrate includes: an insulating layer; first electrode pads having first exposed surfaces, the first exposed surfaces being exposed from the insulating layer; and second electrode pads having second exposed surfaces, the second exposed surfaces being exposed from the insulating layer. There is a level difference between the first exposed surfaces and the second exposed surfaces.

9 Claims, 15 Drawing Sheets

WIRING SUBSTRATE AND METHOD OF MANUFACTURING THE SAME This application claims priority from Japanese Patent Application No. 2009-133604, filed on Jun. 3, 2009, the entire contents of which are herein incorporated by reference.

BACKGROUND

1. Technical Field

The present disclosure relates to a wiring substrate and a method of manufacturing the same.

2. Related Art

For example, when electrode pads are formed on a wiring substrate by a substructive method, a resist pattern having openings is formed on the surface of a copper foil, the copper foil exposed from the openings is etched, and the resist pattern is removed. Thus, electrode pads are formed of the remaining copper foil.

When electrode pads are formed on a wiring substrate by a semi-additive method, first of all, a seed layer is formed on an insulating layer at the outermost surface of the substrate by an electroless plating method, and a resist pattern having openings is formed on the surface of the seed layer. Next, electrode pads are formed on the seed layer exposed from the openings by electrolytic plating, the resist pattern is removed, and an unnecessary seed layer is removed by etching. Thus, electrode pads are formed of an electrolytic plated film.

As described above, the electrode pads can be formed on the wiring substrate by various methods. Meanwhile, the structure of a wiring substrate having electrode pads, in particular, the structure of a wiring substrate having electrode pads exposed from the insulating layer at the outermost surface of the substrate is described in JP-A-2005-327780, JP-A-2002-198462 and JP-A-2007-13092, for example.

JP-A-2005-327780 describes a wiring substrate for a semiconductor package in which all of lower wiring layers are located at positions where concave portions of a base insulating film are recessed. In this wiring substrate, an easy-to-etch layer on all of the lower wiring layers is removed, such that concave portions are formed.

JP-A-2002-198462 describes a wiring substrate for a semiconductor package in which a plurality of electrodes are exposed from the bottom of concave portions of an insulating layer. In this wiring substrate, all of the electrodes are etched and removed by a predetermined thickness from the lower surface of the wiring substrate.

JP-A-2007-13092 describes a wiring substrate in which a plurality of electrodes are recessed from the outer surface of a solder resist layer. In this wiring substrate, all of the electrodes are recessed by etching an electrode height adjusting layer on the electrodes.

FIG. 45 shows a semiconductor package including a wiring substrate 101, in which a plurality of electrode pads 102 are exposed from an insulating layer 103. In the wiring substrate 101 shown in FIG. 45, similarly to the wiring substrates described in JP-A-2005-327780, JP-A-2002-198462 and JP-A-2007-13092, mounting surfaces of a plurality of electrode pads 102 are exposed from concave portions 104 having the same depth formed in the insulating layer 103. The wiring substrate 101 includes a wiring layer 105 which forms external connection terminals, solder resist 106 which covers the wiring layer 105, and vias 107 which are formed in the solder resist 106 and electrically connect the electrode pads 102 and the wiring layer 105.

For example, when a semiconductor chip is mounted on the electrode pads 102 side of the wiring substrate 101, the electrode pads 102 and the external connection terminals (for example, electrode bumps) of the semiconductor chip are electrically connected to each other. In addition to the semiconductor chip, a heat sink (for example, a lid) for heat dissipation of the semiconductor chip, an additional wiring substrate, and electronic components, such as a chip capacitor, may be mounted on the wiring substrate 101.

Meanwhile, with high-function and reduction in size of semiconductor devices, there are demands for reduction in size and thickness of semiconductor packages (wiring substrate) on which a semiconductor chip is mounted, and for miniaturization and reduction in pitch of wiring layers or electrode pads. To meet such demands, when various components, such as a semiconductor chip, a heat sink, an additional wiring substrate, and electronic components, are mounted on the wiring substrate 101, the degree of freedom regarding mounting is low.

When various components, such as a semiconductor chip and a heat sink, are mounted on the wiring substrate 101, external connection terminals having different sizes of various components may be connected to a plurality of electrode pads 102 of the wiring substrate 101. In this case, the semiconductor chip, the heat sink, and the like are mounted on the wiring substrate 101 only by controlling the amount of a connection material, such as solder, which is used for the external connection terminals. For example, with regard to reduction in thickness of the semiconductor package, like the electrode pads 102 of the wiring substrate 101, when all of the mounting surfaces have the same depth from the outermost surface, it is necessary to adjust the connection height of various components by the amount of solder for mounting, such that the degree of freedom regarding mounting is low. For this reason, the amount of solder for connection differs between various components. Accordingly, it is difficult to adjust the amount of solder, and reliability of the connection portions is deteriorated.

SUMMARY OF THE INVENTION

Exemplary embodiments of the present invention address the above disadvantages and other disadvantages not described above. However, the present invention is not required to overcome the disadvantages described above, and thus, an exemplary embodiment of the present invention may not overcome any disadvantages described above.

Accordingly, it is an illustrative aspect to provide a technique capable of improving reliability of a wiring substrate.

According to one or more illustrative aspects of the present invention, there is provided a wiring substrate. The wiring substrate includes: an insulating layer; first electrode pads having first exposed surfaces, the first exposed surfaces being exposed from the insulating layer; and second electrode pads having second exposed surfaces, the second exposed surfaces being exposed from the insulating layer. There is a level difference between the first exposed surfaces and the second exposed surfaces.

According to one or more illustrative aspects of the present invention, there is provided a method of manufacturing a wiring substrate. The method includes: (a) forming a first resist layer having first openings therein on a first surface of a conductive support plate; (b) forming depth adjusting films in the first openings by an electrolytic plating method using the support plate as a plating conduction plate, wherein a material of the depth adjusting films is different from that of the support plate; (c) forming first plated films on the depth adjusting films by an electrolytic plating method using the support plate as a plating conduction plate, wherein a material of the first plated films is different from that of the depth adjusting films; (d) removing the first resist layer; (e) forming a second resist layer having second openings therein on the first surface of the support plate; (f) forming second plated films in the second openings by an electrolytic plating method using the support plate as a plating conduction plate, wherein a material of the second plated films is different from that of the support plate; (g) removing the second resist layer; (h) forming a wiring layer and an insulating layer such that the wiring layer is electrically connected to the first and second plated films; (i) removing the support plate; and (j) removing the depth adjusting films.

According to one or more illustrative aspects of the present invention, there is provided a method of manufacturing a wiring substrate. The method includes: (a) forming a first resist layer having first openings therein on a first surface of a conductive support plate; (b) forming first depth adjusting films in the first openings by an electrolytic plating method using the support plate as a plating conduction plate, wherein a material of the first depth adjusting films is different from that of the support plate; (c) forming first plated films on the first depth adjusting films by an electrolytic plating method using the support plate as a plating conduction plate, wherein a material of the first plated films is different from that of the first depth adjusting films; (d) removing the first resist layer; (e) forming a second resist layer having second openings therein on the first surface of the support plate; (f) forming second depth adjusting films in the second openings by an electrolytic plating method using the support plate as a plating conduction plate, wherein a material of the second depth adjusting films are the same as that of the support plate; (g) forming second plated films on the second depth adjusting films by an electrolytic plating method using the support plate as a plating conduction plate, wherein a material of the second plated films is different from that of the second depth adjusting films; (h) removing the second resist films; (i) forming a wiring layer and an insulating layer such that the wiring layer is electrically connected to the first and second plated films; (j) removing the support plate and the second depth adjusting films at the same time; and (k) removing the first depth adjusting films.

Other aspects and advantages of the present invention will be apparent from the following description, the drawings and the claims.

DETAILED DESCRIPTION OF EXEMPLARY EMBODIMENTS

Figure 1:
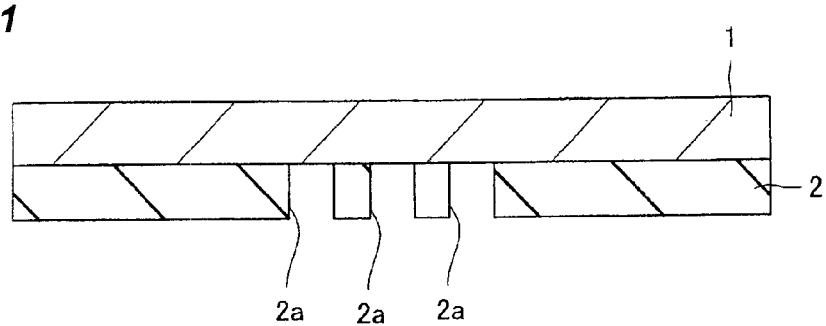
FIG. 1 is a schematic sectional view of a semiconductor package in a manufacturing process according to a first embodiment of the invention.

Hereinafter, embodiments of the invention will be described in detail with reference to the drawings. In the drawings for the explanation of the embodiments, the members having the same functions are represented by the same reference numerals, and repeated description thereof will be omitted.

In the embodiments of the invention, a wiring substrate may be applied to a semiconductor package, an interposer, a mounting substrate, and the like, and in particular, to a semiconductor package. In the following embodiments, a semiconductor package using a wiring substrate will be described.

First Embodiment

A method of manufacturing a semiconductor package of this embodiment will be described with reference to the drawings. First, as shown in FIG. 1, a resist layer 2 (plated resist layer) having openings 2a is formed on a conductive support plate 1. The conductive support plate 1 is, for example, a Cu (copper) foil having a thickness of about 500 µm. The resist layer 2 is formed of, for example, dry film resist or liquid resist having a predetermined thickness. For example, dry film resist is formed on the support plate 1, and exposure and development is carried out for the dry film resist. Thus, the resist layer 2 having the openings 2a is formed on the support plate 1.

The support plate 1 may be formed of a different material, such as an Al (aluminum) foil, insofar as the material is conductive. According to this embodiment, this is because, in a subsequent step, an electrolytic plating method is carried out using the support plate 1 as a plating conduction plate. The support plate 1 preferably has a thickness such that no warpage occurs in the support plate 1 during the manufacturing process. If the support plate 1 is too thin and thus warpage occurs, for example, a positioning shift may occur and manufacturing yield may be degraded. In this embodiment, in a subsequent step, the support plate 1 is formed of a Cu foil and is removed by etching. Thus, the support plate 1 preferably has a thickness such that no warpage occurs and etching is completed in a short time.

Figure 2:
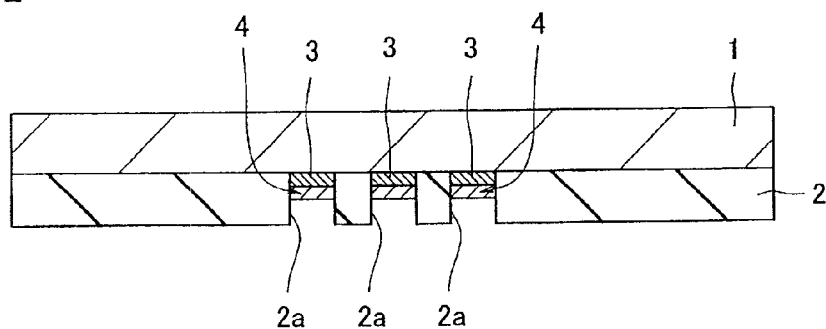
FIG. 2 is a schematic sectional view of the semiconductor package in the manufacturing process subsequent to FIG. 1.

Subsequently, as shown in FIG. 2, a depth adjusting film 3 of a material different from the support plate 1 is formed on the support plate 1 at the openings 2a of the resist layer 2 by an electrolytic plating method using the support plate 1 as a plating conduction plate. The depth adjusting film 3 is, for example, an Ni (nickel) plated film having a thickness of about 10 µm to about 20 µm. In this embodiment, since a Cu foil is used for the support plate 1, an Ni plated film of a material different from the support plate 1 is used for the depth adjusting film 3. In a subsequent step, the support plate 1 formed of a Cu foil is removed by etching while the depth adjusting film 3 remains at that time. For this reason, an Ni plated film of a material having an etching rate different from a Cu foil is used for the depth adjusting film 3.

Next, a plated film 4 of a material different from the depth adjusting film 3 is formed on the depth adjusting film 3 at the openings 2a of the resist layer 2 by an electrolytic plating method using the support plate 1 as a plating conduction plate. The plated film 4 is used to form electrode pads, unlike the depth adjusting film 3.

The plated film 4 is, for example, a Cu plated film having a thickness of about 10 µm to about 20 µm. In this embodiment, since an Ni plated film is formed as the depth adjusting film 3, a Cu plated film of a material different from an Ni plated film is formed as the plated film 4. In a subsequent step, the depth adjusting film 3 formed of an Ni plated film is removed by etching while the plated film 4 remains at that time. For this reason, a Cu plated film of a material having an etching rate different from the Ni plated film is formed as the plated film 4.

The plated film 4 may be an Au (gold) plated film, a Pd (palladium) plated film, or a laminated film including a Cu plated film, an Au plated film, and a Pd plated film insofar as the plated film 4 is formed of a material different from the depth adjusting film 3 formed of an Ni plated film. It should suffice that the plated film 4 remains at the time of etching of the depth adjusting film 3. Thus, for example, a Cu plated film (in this case, the Cu plated film functions as an etching stopper) of a material different from the depth adjusting film 3 may be formed on the depth adjusting film 3 formed of an Ni plated film, and an Ni plated film of the same materials as the depth adjusting film 3 may be formed on the Cu plated film.

Figure 3:
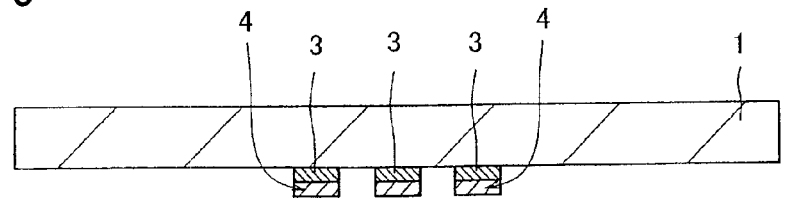
FIG. 3 is a schematic sectional view of the semiconductor package in the manufacturing process subsequent to FIG. 2.

Subsequently, as shown in FIG. 3, the resist layer 2 is removed.

Figure 4:
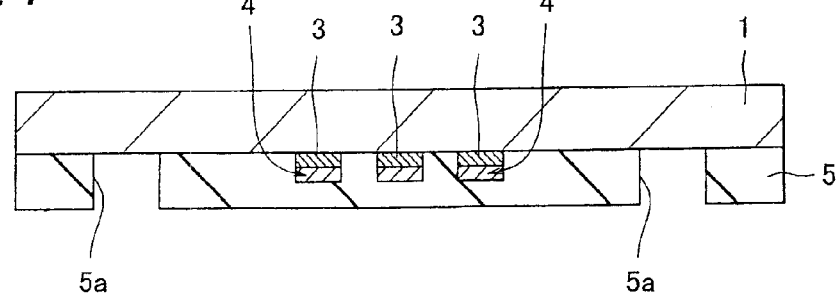
FIG. 4 is a schematic sectional view of the semiconductor package in the manufacturing process subsequent to FIG. 3.

Subsequently, as shown in FIG. 4, a resist layer 5 having openings 5a is formed on the support plate 1. For example, the openings 5a may be formed in frame shape. The resist layer 5 is formed in the same manner as the resist layer 2 so as to cover the depth adjusting film 3 and the plated film 4 formed on the support plate 1.

Figure 5:
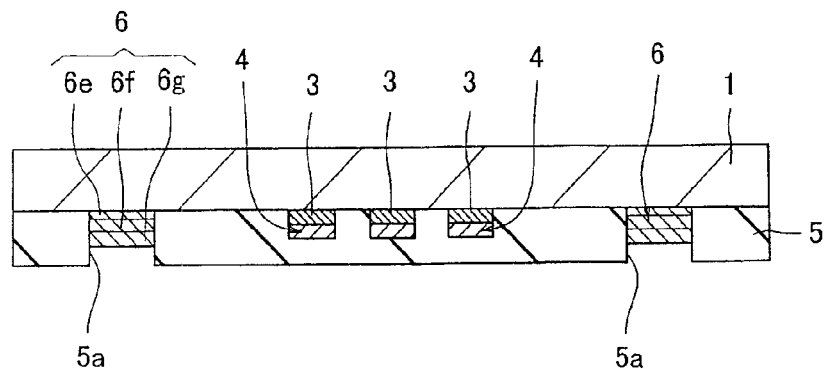
FIG. 5 is a schematic sectional view of the semiconductor package in the manufacturing process subsequent to FIG. 4.

Subsequently, as shown in FIG. 5, a plated film 6 of a material different from the support plate 1 is formed on the support plate 1 at the openings 5a of the resist layer 5 by an electrolytic plating method using the support plate 1 as a plating conduction plate. The plated film 6 is used to form electrode pads.

The plated film 6 may be a single-layered film, and in this embodiment, the plated film 6 is a laminated film of Au plated film 6e/Ni plated film 6f/Cu plated film 6g (a Pd plated film may be formed between the Au plated film 6e and the Ni plated film 6f) in order from the support plate 1. Since a Cu foil is formed as the support plate 1, an Au plated film of a material different from the support plate 1 is formed on the side of the plated film 6 facing the support plate 1. In a subsequent step, the support plate 1 formed of a Cu foil is removed by etching while the plated film 6 remains at that time. For this reason, an Au plated film of a material having a different etching rate is formed as an etching stopper on the side of the plated film 6 facing the support plate 1.

In this embodiment, in forming the plated film 6, the plated film 6 is also formed of a material different from the plated film 4. Since a Cu plated film is formed as the plated film 4, an Au plated film of a material different from a Cu plated film is formed on the side of the plated film 6 facing the support plate 1. In a subsequent step, the plated films 4 and 6 are used as the electrode pads of the wiring substrate. Thus, for example, electrode pads of different materials can be formed to correspond to the external connection terminals of various components mounted on the wiring substrate.

When a plated film of a material having an etching rate different from the support plate 1 is formed on the support plate 1 side, a plated film which is subsequently formed may be formed of the same material as the support plate 1 insofar as electrode pads can be formed. In this embodiment, since the support plate 1 is formed of Cu, the plated film 6 is a laminated film in which an Au plated film of a material having an etching rate different from the support plate 1 is formed on the support plate 1 side, and an Ni plated film and a Cu plated film are subsequently formed.

Figure 6:
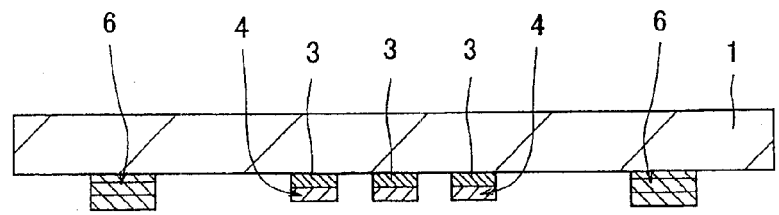
FIG. 6 is a schematic sectional view of the semiconductor package in the manufacturing process subsequent to FIG. 5.

Subsequently, as shown in FIG. 6, the resist layer 5 is removed.

Figure 7:
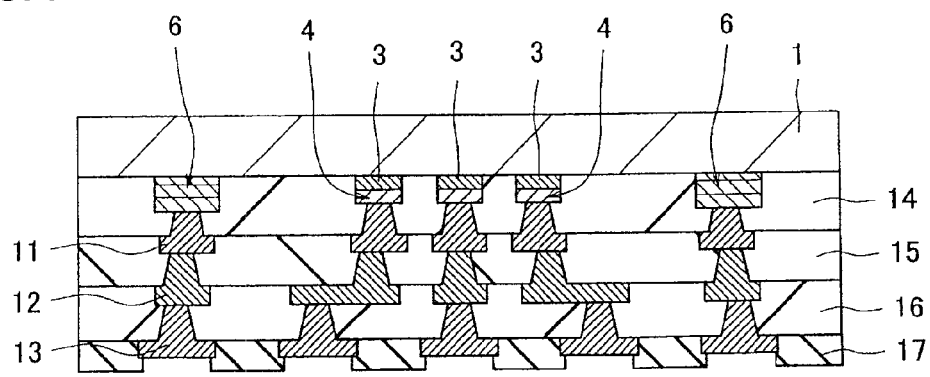
FIG. 7 is a schematic sectional view of the semiconductor package in the manufacturing process subsequent to FIG. 6.

Subsequently, as shown in FIG. 7, a wiring layer electrically connected to the plated film 4 and the plated film 6 is formed. The wiring layer is, for example, a build-up wiring layer including wiring layers 11, 12, and 13 and insulating interlayers 14, 15, and 16.

First, the insulating interlayer 14 is formed so as to cover the depth adjusting film 3/plated film 4, and the plated film 6 formed on the support plate 1, via holes are formed to reach the depth adjusting film 3/plated film 4, and the plated film 6, and the wiring layers 11 are formed to be electrically connected to the plated film 4 and the plated film 6 through the via holes.

The insulating interlayer 14 is formed, for example, by laminating a resin film, such as epoxy-based resin or polyimide-based resin. The via holes are openings which are formed in the insulating interlayer 14 to reach the plated film 4 and the plated film 6 by laser or dry etching with the plated film 4 and the plated film 6 as a stopper.

The wiring layers 11 are formed, for example, by a semiadditive method. First, a seed layer (not shown) is formed in the via holes and on the insulating interlayer 14 by electroless plating or the like, and a resist layer (not shown) is formed which has openings corresponding to regions where the wiring layers 11 are to be formed. Next, for example, a Cu plated film is formed in the openings of the resist layer by an electrolytic plating method using the seed layer as a plating conduction plate. Next, the resist layer is removed, and the seed layer is etched using the Cu plated film as a mask. Thus, the wiring layers 11 of the Cu plated film are formed, each of which includes a via formed in the via hole and a wiring pattern formed on the insulating interlayer 14.

Next, the same step as the step of forming the insulating interlayer 14 and the wiring layers 11 is repeatedly performed. Specifically, the insulating interlayer 15 is formed so as to cover the wiring layers 11 formed on the insulating interlayer 14, via holes are formed to reach the wiring layers 11, and the wiring layers 12 are formed to be electrically connected to the wiring layers 11 through the via holes.

Next, the same step as the step of forming the insulating interlayer 14 and the wiring layers 11 is repeatedly performed. Specifically, the insulating interlayer 16 is formed so as to cover the wiring layers 12 formed on the insulating interlayer 15, via holes are formed to reach the wiring layers 12, and the wiring layers 13 are formed to be electrically connected to the wiring layers 12 through the via holes. Thus, a wiring layer (build-up wiring layer) is formed which includes the wiring layers 11, 12, and 13 and the insulating interlayers 14, 15, and 16.

Next, solder resist 17 having openings through which the surfaces of the wiring layers 13 are exposed is formed on the insulating interlayer 16. The solder resist 17 is formed, for example, by forming film-like resist on the insulating interlayer 16 and carrying out exposure and development for the resist. The wiring layers 13 exposed from the solder resist 17 are used as electrode pads. The solder resist 17 prevents short-circuiting at the time of connection to external connection terminals, and protects the wiring layers 13.

Next, surface treatment is carried out to protect the exposed wiring layers 13. Though not shown, an OSP (Organic Solder Preservative) film, an electroless Ni/Pd/Au plated film, or an electroless Ni/Au plated film is formed on the exposed wiring layers 13. Also, the electroless Ni/Pd/Au or Ni/Au plated film is formed on the exposed wiring layers 13 such that Au film is exposed to the outside of the wiring substrate.

Figure 8:
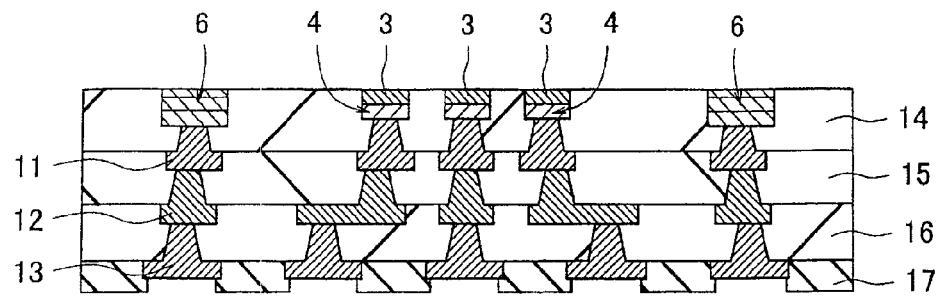
FIG. 8 is a schematic sectional view of the semiconductor package in the manufacturing process subsequent to FIG. 7.

Subsequently, as shown in FIG. 8, the support plate 1 is removed. When the support plate 1 is formed of a Cu foil, for example, the support plate 1 is removed by etching using an etchant containing copper ammonium chloride. At the time of etching using an etchant containing copper ammonium chloride, the insulating interlayer 14 formed of epoxy-based resin or polyimide-based resin is not removed.

An Ni plated film having an etching rate different from a Cu foil forming the support plate 1 is formed as the depth adjusting film 3. For this reason, when the support plate 1 is removed, the depth adjusting film 3 and the plated film 4 remain unremoved. Thus, the surface (exposed surface) of the depth adjusting film 3 is exposed from the insulating interlayer 14.

An Au plated film having an etching rate different from a Cu foil forming the support plate 1 is formed on the side of the plated film 6 facing the support plate 1. For this reason, when the support plate 1 is removed, the plated film 6 remains unremoved. Thus, the surface (exposed surface) of the plated film 6 is exposed from the insulating interlayer 14.

Figure 9:
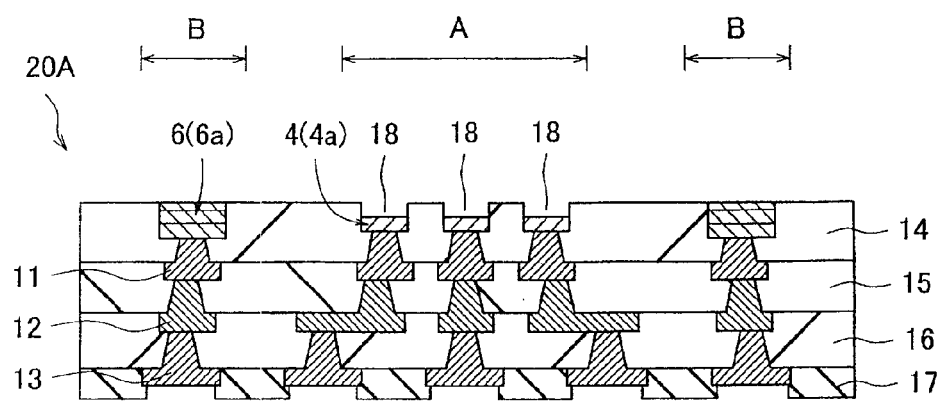
FIG. 9 is a schematic sectional view of the semiconductor package in the manufacturing process subsequent to FIG. 8.

Subsequently, as shown in FIG. 9, the depth adjusting film 3 is removed, such that concave portions 18 are formed on the plated film 4. When it is necessary to protect the exposed surfaces of the electrode pads, for example, an OSP film may be formed on the plated film 4.

When an Ni plated film is used for the depth adjusting film 3, for example, the depth adjusting film 3 is removed by etching using an etchant containing nitric acid and hydrogen peroxide solution. An Au plated film having an etching rate different from an Ni plated film for the depth adjusting film 3 is formed on the exposed side of the plated film 6. Thus, when the depth adjusting film 3 is removed, the plated film 6 remains unremoved. At the time of etching using an etchant containing nitric acid and hydrogen peroxide solution, the insulating interlayer 14 formed of epoxy-based resin or polyimide-based resin is not removed.

The plated film 4 is exposed at the bottom of the concave portions 18 formed in the insulating interlayer 14. The depth of the concave portions 18 (the depth from the surface of the insulating interlayer 14) is the same as the thickness of the depth adjusting film 3. For example, when the thickness of the depth adjusting film 3 is in a range of about 10 μm to about 20 μm, the depth of the concave portions 18 is in a range of about 10 μm to about 20 μm. When the depth adjusting film 3 is extremely thin, no concave portions 18 may be substantially formed, and the exposed surface of the plated film 4 and the surface of the insulating interlayer 14 may be substantially flush with each other (flat).

In this way, a wiring substrate 20A for a semiconductor package is formed. FIG. 12 is a plan view schematically showing the wiring substrate 20A. FIGS. 1 to 9 described above and FIGS. 10 and 11 described below show the section of a semiconductor package in the manufacturing process taken along the line X-X of FIG. 12.

In this embodiment, in FIG. 12, a region represented by reference numeral A is a chip mounting region, and a region represented by reference numeral B is a lid mounting region. Electrode pads 4a which are connected to external connection terminals of a semiconductor chip to be mounted are formed in the region A at the central portion of the wiring substrate 20A. Electrode pads 6a (seal ring) which are connected to a connection portion of a lid (heat sink) to be mounted are formed in the region B at the peripheral portion adjacent to the central portion of the wiring substrate 20A in a frame shape so as to surround the region A.

The wiring substrate 20A is a coreless substrate which is formed using the support plate 1, instead of a core substrate of a general wiring substrate. In this embodiment, surface treatment is used for the support plate 1, that is, patterning and plating are carried out multiple times, such that arbitrary different steps may be formed at the exposed surfaces of the plated films 4 and 6 on the surface of the wiring substrate 20A (coreless substrate) after the support plate 1 is removed.

The arbitrary different steps will be described. Although in this embodiment, a case where no depth is given from the insulating interlayer 14 to the exposed surface of the plated film 6, and the exposed surface of the plated film 6 is flush with the surface of the insulating interlayer 14, in any cases including such a case, the depth from the insulating interlayer 14 to the exposed surface of the plated film 6 will be referred to as a step (a depth is given).

The wiring substrate 20A has the electrode pads 4a formed of the plated film 4 and the electrode pads 6a formed of the plated film 6. The electrode pads 4a and the electrode pads 6a are exposed with different depths from the surface of the insulating interlayer 14. The region A of the wiring substrate 20A is formed in a pocket shape, in which the exposed surfaces of the electrode pads 4a are flush with the bottom of the concave portions 18 formed in the insulating interlayer 14. The region B of the wiring substrate 20A is formed in a flat shape, in which the exposed surfaces of the electrode pads 6a are flush with the surface of the insulating interlayer 14. Different steps can be formed at the surface of the wiring substrate 20A corresponding to portions where the electrode pads 4a and the electrode pads 6a are formed due to the difference in depth between the exposed surfaces of the electrode pads 4a and 6a.

In this embodiment, since the support plate 1 is used as a plating conduction plate, it is not necessary to separately form a plating conduction plate (bus line) (busless). Thus, a bus forming step can be omitted, and costs can be reduced. Since the bus forming step is omitted, a plating solution can be prevented from being contaminated with a plating mask material for bus formation. It is not necessary to secure a margin for bus formation. Thus, the electrode pads 4a and 6a with fine pitches can be formed.

Figure 10:
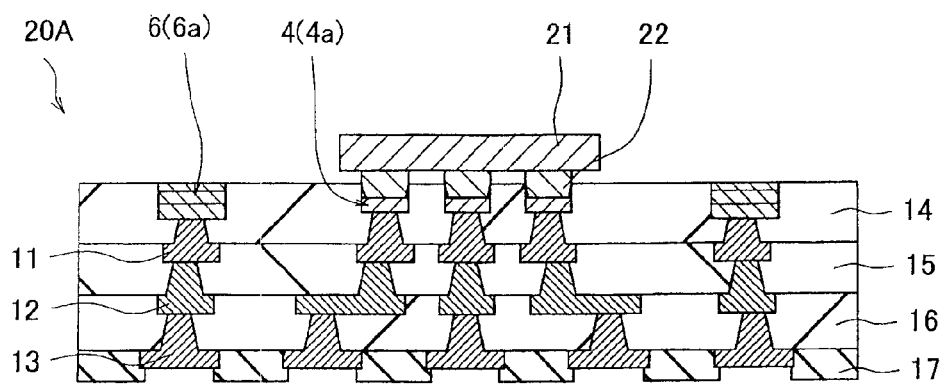
FIG. 10 is a schematic sectional view of the semiconductor package in the manufacturing process subsequent to FIG. 9.

Subsequently, as shown in FIG. 10, a semiconductor chip 21 is mounted on the wiring substrate 20A. External connection terminals 22, such as gold bumps or solder bumps, which are electrically connected to an internal element, are formed at the main surface (element forming surface) of the semiconductor chip 21. The external connection terminals 22 are electrically connected to the electrode pads 4a of the wiring substrate 20A, such that the semiconductor chip 21 is flip-chip mounted on the wiring substrate 20A. Also, underfill resin may be provided between the wiring substrate 20A and the semiconductor chip 21.

Figure 11:
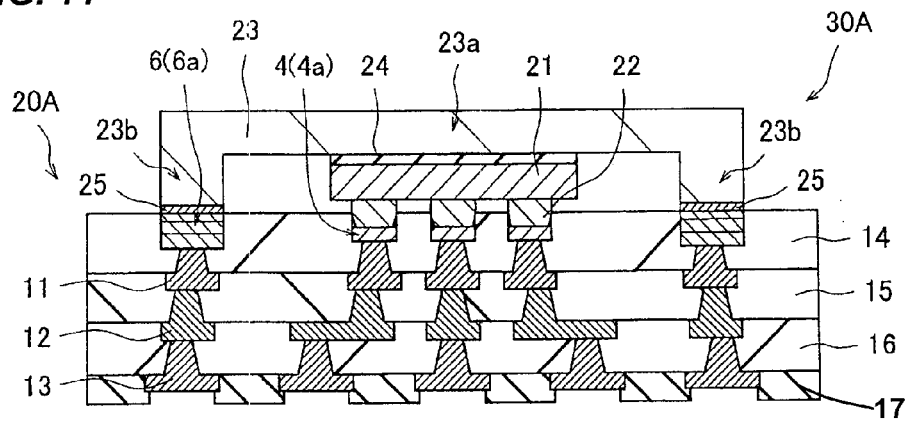
FIG. 11 is a schematic sectional view of the semiconductor package in the manufacturing process subsequent to FIG. 10.
Figure 12:
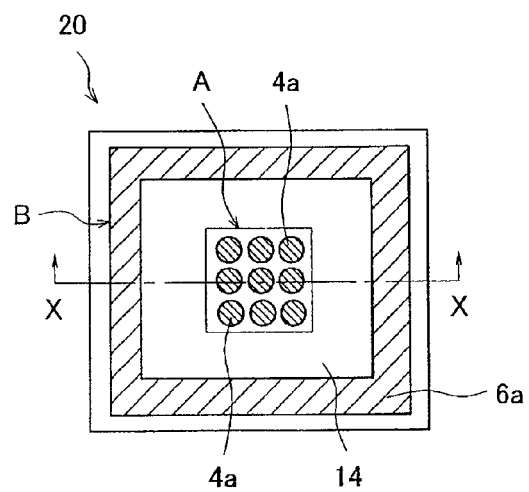
FIG. 12 is a schematic plan view of the semiconductor package in the manufacturing process shown in FIG. 9.

Subsequently, as shown in FIG. 11, a conductive lid 23 (cover) for heat dissipation is mounted on the wiring substrate 20A. The lid 23 may be used for stabilization of the circuit operation when being connected to the reference potential (GND) or blocking of external noise, in addition to heat dissipation. When the lid 23 is used for heat dissipation, the electrode pads 6a need not to be electrically connected to the GND. In this case, the lid 23 is mechanically connected to the electrode pads 6a.

The lid 23 shown in FIG. 11 has a box shape and includes a cover portion 23a which has a rectangular shape in plan view, and a connection portion 23b which protrudes in a frame shape at the periphery of the cover portion 23a. The rear surface (the surface opposite to the main surface) of the semiconductor chip 21 is in contact with the cover portion 23a through grease 24, and the lower surface of the connection portion 23b is electrically connected to the electrode pads 6a of the wiring substrate 20A, for example, through solders 25. In this way, the lid 23 is bonded onto the wiring substrate 20A. Thus, the semiconductor chip 21 and the lid 23 are mounted in a state where the lid 23 is bonded to the rear surface of the semiconductor chip 21 through the grease 24, such that the semiconductor chip 21 is covered inside the boxlike lid 23.

As described above, the semiconductor chip 21 and the lid 23 are mounted on the wiring substrate 20A. The semiconductor chip 21 is mounted on the wiring substrate 20A in a state where the external connection terminals 22 formed at the main surface of the semiconductor chip 21 are electrically connected to the electrode pads 4a. The boxlike lid 23 is mounted on the wiring substrate 20A so as to cover the semiconductor chip 21 in a state where the connection portion 23b formed in the lid 23 is electrically connected to the electrode pads 6a.

In this way, a semiconductor package 30A is formed which has the wiring substrate 20A, on which the semiconductor chip 21 and the lid 23 are mounted. With high-function and reduction in size of semiconductor devices, there are demands for reduction in size and thickness of semiconductor packages on which a semiconductor chip is mounted. The wiring substrate 20A is a coreless substrate which is formed using the support plate 1, which will be removed in a subsequent step, instead of a core substrate having a certain thickness. Thus, the wiring substrate 20A can be reduced in thickness (for example, about 170 to 200 μm). Therefore, the semiconductor package 30A can be reduced in size and thickness.

Figure 45:
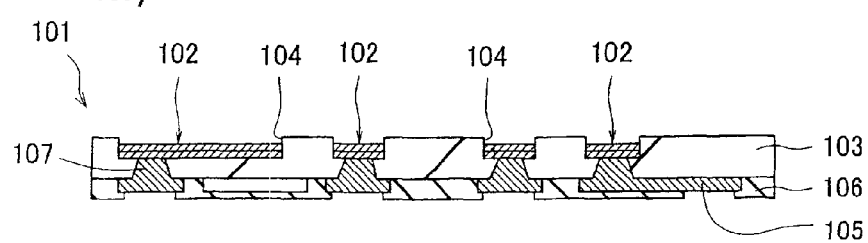
FIG. 45 is a schematic sectional view of a semiconductor package according to the related art.

From the viewpoint of reduction in thickness of the semiconductor package, when various components are mounted on the wiring substrate, as described with reference to FIG. 45, if all of the mounting surfaces (exposed surfaces) of the electrode pads 102 of the wiring substrate 101 have the same depth from the outermost surface, it is necessary to adjust the height by the amount of solder (connection material) for mounting.

However, according to this embodiment, depth control of the mounting surfaces (exposed surfaces) of the electrode pads is carried out, in addition to adjustment of the amount of solder, such that the degree of freedom when components are mounted on the wiring substrate increases. Specifically, for example, as shown in FIG. 11, the electrode pads 4a and 6a are exposed with different depths from the surface of the insulating interlayer 14. Therefore, the degree of freedom in terms of capacity for mounting various components (the semiconductor chip 21 and the lid 23) on the wiring substrate 20A can increase.

From the viewpoint of reduction in thickness of the semiconductor package 30A, height adjustment of various components mounted on the wiring substrate 20A may focus on depth control of the mounting surfaces (exposed surfaces) of the electrode pads 4a and 6a, and from the viewpoint of connection of the wiring substrate 20A and various components, control of the amount of solder (connection material)

may be focused. Therefore, connection strength of the wiring substrate 20A and various components can be increased, such that the reliability of the semiconductor package 30A can be improved.

In this embodiment, according to various components (the semiconductor chip 21 and the lid 23), the depth of each electrode pad 4a is deeper than the depth of each electrode pad 6a, and the area of the exposed surface of each electrode pad 4a is smaller than the area of the exposed surface of each electrode pad 6a. In this way, the depths and areas of the electrode pads 4a and 6a are adjusted according to various components mounted on the wiring substrate 20A. Thus, stress or strain imposed on the electrode pads 4a and 6a, the external connection terminals 22, and the connection portion 23b can be prevented, and the reliability of the semiconductor package 30A can be improved. From this viewpoint, the depth of each electrode pad 4a may be deeper than the depth of each electrode pad 6a, and the area of the exposed surface of each electrode pad 4a may be larger than the area of the exposed surface of each electrode pad 6a. In addition, the depth of each electrode pad 4a may be shallower than the depth of each electrode pad 6a, and the area of the exposed surface of each electrode pad 4a may be smaller or larger than the area of the exposed surface of each electrode pad 6a.

The height of each of the external connection terminals 22 of the semiconductor chip 21 and the depth of each of the electrode pads 4a are adjusted. Thus, the external connection terminals 22 are fixed so as to fit into the concave portions 18 on the electrode pads 4a, such that the wiring substrate 20A and the semiconductor chip 21 can be connected to each other. Therefore, the reliability of the semiconductor package 30A can be improved.

Various components (the semiconductor chip 21 and the lid 23) can be mounted on the wiring substrate 20A of this embodiment, and the electrode pads 4a and 6a may be formed of materials corresponding to various components. In this embodiment, with regard to connection to the semiconductor chip 21, for example, Cu is used for the exposed surfaces of the electrode pads 4a to achieve good transmission of electrical signals. In addition, for example, Au is used for the exposed surfaces of the electrode pads 6a, which are connected to the lid 23, to prevent oxidization, thereby improving solder connectivity. As described above, different materials are used for the exposed surfaces of the electrode pads 4a and 6a to correspond to components to be mounted, such that electrical characteristics and reliability of the semiconductor package 30A can be improved.

Second Embodiment

Figure 16:
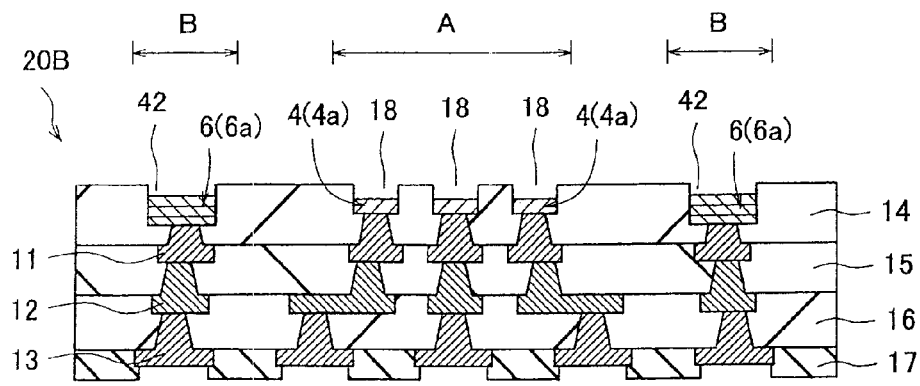
FIG. 16 is a schematic sectional view of the semiconductor package in the manufacturing process subsequent to FIG. 15.

In the first embodiment, as shown in FIG. 9, a case has been described where, in the region B at the peripheral portion of the wiring substrate 20A, the exposed surfaces of the electrode pads 6a are flush with the surface of the insulating interlayer 14. In this embodiment, as shown in FIG. 16, a case will be described where, in a region B at the peripheral portion of a wiring substrate 20B, the exposed surfaces of electrode pads 6a are flush with the bottom of concave portions 42 formed in the insulating interlayer 14. Overlapping description between the foregoing embodiment and this embodiment may be omitted hereinafter.

Figure 13:
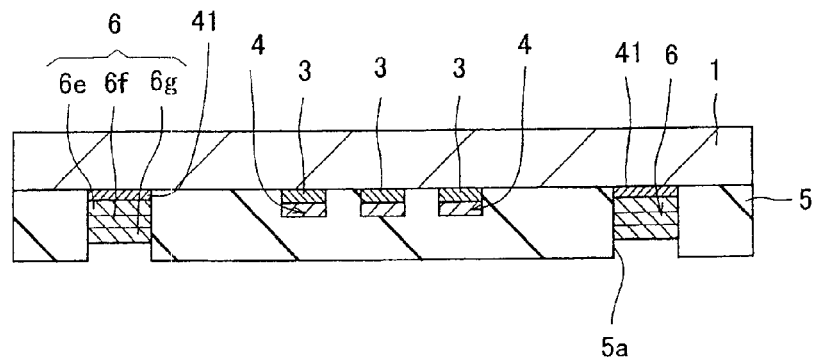
FIG. 13 is a schematic sectional view of a semiconductor package in a manufacturing process according to a second embodiment of the invention.

A method of manufacturing a semiconductor package of this embodiment will be described with reference to the drawings. After the manufacturing process of the first embodiment described with reference FIGS. 1 to 4, as shown in FIG. 13, a depth adjusting film 41 of the same material as the support plate 1 is formed on the support plate 1 at the openings 5a of the resist layer 5 by an electrolytic plating method using the support plate 1 as a plating conduction plate. The depth adjusting film 41 is, for example, a Cu plated film having a thickness of about 5 μm. In this embodiment, since a Cu foil is used for the support plate 1, a Cu plated film of the same material as a Cu foil is used for the depth adjusting film 41. In a subsequent step, the support plate 1 formed of a Cu foil is removed by etching, and the depth adjusting film 41 is also removed at the time of etching of the support plate 1. Thus, a Cu plated film of the same material as a Cu foil is used for the depth adjusting film 41.

Next, a plated film 6 of a material different from the depth adjusting film 41 is formed on the depth adjusting film 41 at the openings 5a of the resist layer 5 by an electrolytic plating method using the support plate 1 as a plating conduction plate. The plated film 6 is used to form electrode pads, unlike the depth adjusting film 41.

The plated film 6 may be a single-layered film, but in this embodiment, the plated film 6 is a laminated film of Au plated film 6e/Ni plated film 6f/Cu plated film 6g (a Pd plated film may be formed between the Au plated film 6e and the Ni plated film 6f) in order from the support plate 1. Since a Cu plated film is formed as the depth adjusting film 41, an Au plated film of a material different from a Cu plated film is formed on the side of the plated film 6 facing the support plate 1. In a subsequent step, the support plate 1 formed of a Cu foil and the depth adjusting film 41 formed of a Cu plated film are removed by etching while the plated film 6 remains at the time of etching of the support plate 1 and the depth adjusting film 41. For this reason, an Au plated film, serving as an etching stopper, of a material having a different etching rate is formed on the side of the plated film 6 facing the support plate 1.

Figure 14:
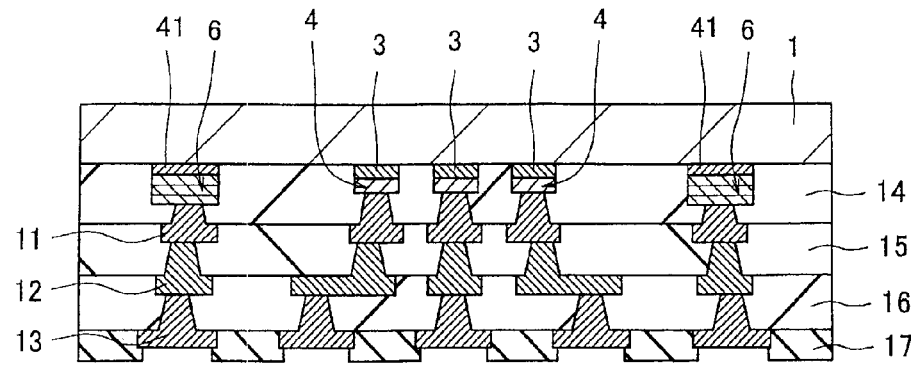
FIG. 14 is a schematic sectional view of the semiconductor package in the manufacturing process subsequent to FIG. 13.

Next, after the resist layer 5 is removed, as shown in FIG. 14, a wiring layer (build-up wiring layer) which includes wiring layers 11, 12, and 13 and insulating interlayers 14, 15, and 16 is formed so as to cover the plated film 4 and the plated film 6.

Figure 15:
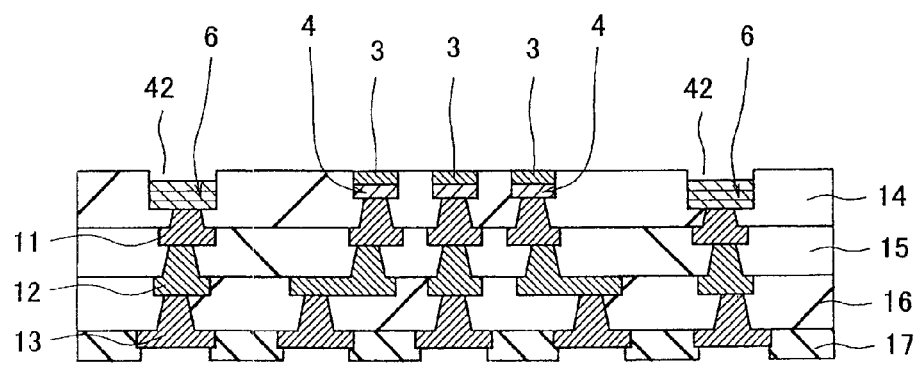
FIG. 15 is a schematic sectional view of the semiconductor package in the manufacturing process subsequent to FIG. 14.

Subsequently, as shown in FIG. 15, the support plate 1 and the depth adjusting film 41 are removed. When a Cu foil is used for the support plate 1, and a Cu plated film is used for the depth adjusting film 41, for example, the support plate 1 and the depth adjusting film 41 are removed by etching using an etchant containing copper ammonium chloride. At the time of etching, the insulating interlayer 14 formed of epoxy-based resin or polyimide-based resin is not removed.

An Ni plated film having an etching rate different from a Cu foil forming the support plate 1 is formed as the depth adjusting film 3. For this reason, when the support plate 1 is removed, the depth adjusting film 3 and the plated film 4 remain unremoved. Thus, the surface (exposed surface) of the depth adjusting film 3 is exposed from the insulating interlayer 14.

An Au plated film having an etching rate different from a Cu foil forming the support plate 1 and a Cu plated film forming the depth adjusting film 41 is formed on the side of the plated film 6 facing the support plate 1. Thus, when the support plate 1 and the depth adjusting film 41 are removed, the plated film 6 remains unremoved. The depth adjusting film 41 is removed, such that the concave portions 42 are formed on the plated film 6, and thus the surface (exposed surface) of the plated film 6 is exposed from the insulating interlayer 14.

As described above, the plated film 6 is exposed at the bottom of the concave portions 42 formed in the Insulating interlayer 14. The depth of the concave portions 42 (the depth from the surface of the insulating interlayer 14) is the same as the thickness of the depth adjusting film 41. For example, when the thickness of the depth adjusting film 41 is about 5 µm, the depth of the concave portions 42 is about 5 µm.

Subsequently, as shown in FIG. 16, the depth adjusting film 3 is removed, such that concave portions 18 are formed on the plated film 4. When an Ni plated film is used for the depth adjusting film 3, for example, the depth adjusting film 3 is removed by etching using an etchant containing nitric acid and hydrogen peroxide solution. An Au plated film having an etching rate different from an Ni plated film forming the depth adjusting film 3 is formed on the exposed side of the plated film 6. Thus, when the depth adjusting film 3 is removed, the plated film 6 remains unremoved. At the time of etching using an etchant containing nitric acid and hydrogen peroxide solution, the insulating interlayer 14 formed of epoxy-based resin or polyimide-based resin is not removed.

As described above, the plated film 4 is exposed at the bottom of the concave portions 18 formed in the insulating interlayer 14. The depth of the concave portions 18 (the depth from the surface of the insulating interlayer 14) is the same as the thickness of the depth adjusting film 3. For example, when the thickness of the depth adjusting film 3 is in a range of about 10 µm to about 20 µm, the depth of the concave portions 18 is in a range of about 10 µm to about 20 µm.

In this way, a wiring substrate 20B for a semiconductor package is formed. Electrode pads 4a which are connected to external connection terminals of a semiconductor chip to be mounted are formed in the region A at the central portion of the wiring substrate 20B. Electrode pads 6a which are connected to a connection portion of a lid (heat sink) to be mounted is formed in the region B at the peripheral portion of the wiring substrate 20B in a frame shape so as to surround the region A.

The wiring substrate 20B has the electrode pads 4a formed of the plated film 4 and the electrode pads 6a formed of plated film 6. The electrode pads 4a and the electrode pads 6a are exposed with different depths from the surface of the insulating interlayer 14. The region A of the wiring substrate 20B is formed in a pocket shape, in which the exposed surfaces of the electrode pads 4a are flush with the bottom of the concave portions 18 formed in the insulating interlayer 14. The region B of the wiring substrate 20B is formed in a pocket shape, in which the exposed surfaces of the electrode pads 6a are flush with the bottom of the concave portions 42 formed in the insulating interlayer 14. Different steps can be formed at the surface of the wiring substrate 20B corresponding to portions where the electrode pads 4a and the electrode pads 6a are formed due to the difference in depth between the exposed surfaces of the electrode pads 4a and 6a.

Figure 17:
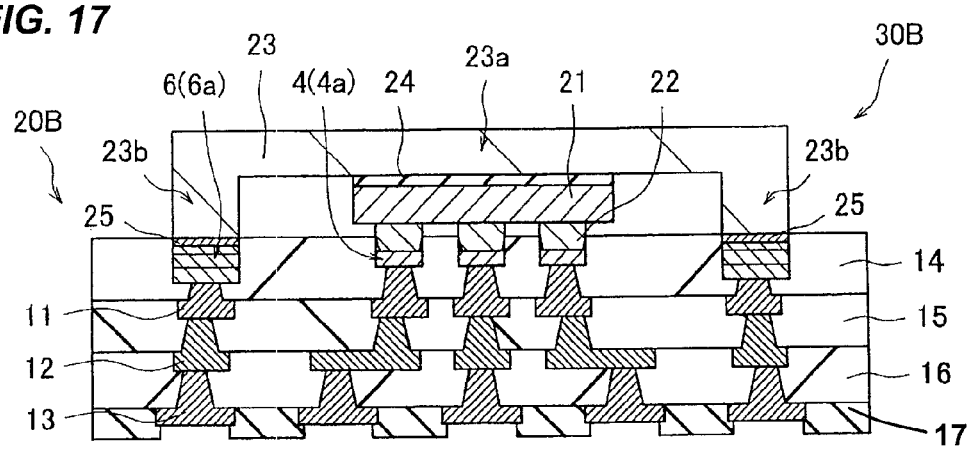
FIG. 17 is a schematic sectional view of the semiconductor package in the manufacturing process subsequent to FIG. 16.

Subsequently, the manufacturing process of the first embodiment described with reference to FIGS. 10 and 11 is carried out, such that, as shown in FIG. 17, a semiconductor package 30B is formed which has the wiring substrate 20B on which the semiconductor chip 21 and the lid 23 are mounted.

The semiconductor package 30B of this embodiment includes the wiring substrate 20B which has the electrode pads 4a and 6a exposed from the insulating interlayer 14. The electrode pads 4a and 6a are exposed with different depths from the surface of the insulating interlayer 14. Thus, the degree of freedom when various components are mounted on the wiring substrate 20B increases by applying depth control of the mounting surfaces (exposed surfaces) of the electrode pads 4a and 6a in addition to control of the amount of a connection material. Therefore, connection strength of the wiring substrate 20B and various components can be increased, such that the reliability of the semiconductor package 30B can be improved.

Third Embodiment

Figure 22:
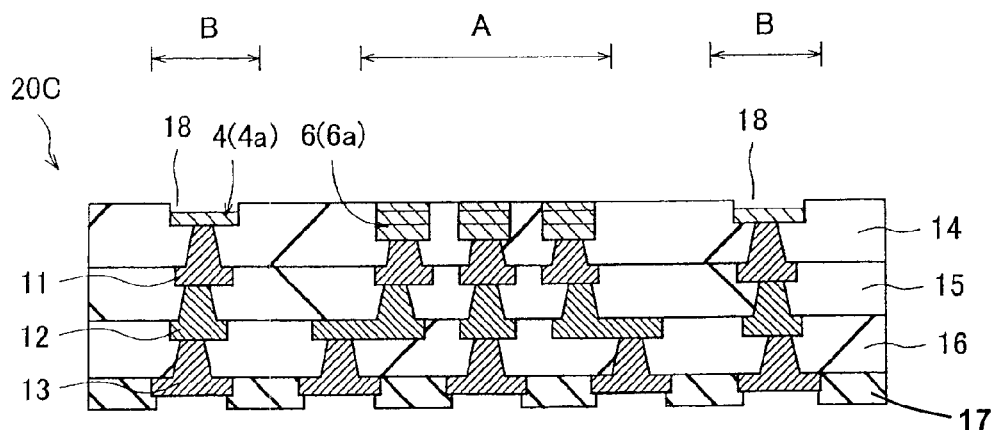
FIG. 22 is a schematic sectional view of the semiconductor package in the manufacturing process subsequent to FIG. 21.

In the first embodiment, as shown in FIG. 9, a case has been described where, in the region A at the central portion of the wiring substrate 20A, the exposed surfaces of the electrode pads 4a are flush with the bottom of the concave portions 18 formed in the insulating interlayer 14, and in the region B at the peripheral portion of the wiring substrate 20A, the exposed surfaces of the electrode pads 6a are flush with the surface of the insulating interlayer 14. In this embodiment, as shown in FIG. 22, a case will be described where, in a region B at the peripheral portion of a wiring substrate 20C, the exposed surfaces of the electrode pads 4a are flush with the bottom of the concave portions 18 formed in the insulating interlayer 14, and in a region A at the central portion of the wiring substrate 20C, the exposed surfaces of the electrode pads 6a are flush with the surface of the insulating interlayer 14. Overlapping description between the foregoing embodiments and this embodiment will be omitted herein.

Figure 18:
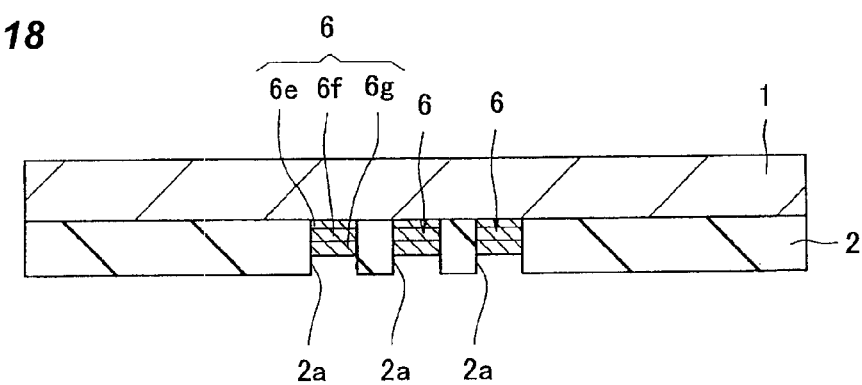
FIG. 18 is a schematic sectional view of a semiconductor package in a manufacturing process according to a third embodiment of the invention.

A method of manufacturing a semiconductor package of this embodiment will be described with reference to the drawings. After the manufacturing process of the first embodiment described with reference to FIG. 1, as shown in FIG. 18, a plated film 6 of a material different from the support plate 1 is formed on the support plate 1 at the openings 2a of the resist layer 2 by an electrolytic plating method using the support plate 1 as a plating conduction plate. The plated film 6 is used to form electrode pads.

The plated film 6 may be a single-layered film, but in this embodiment, the plated film 6 is a laminated film of Au plated film 6e/Ni plated film 6f/Cu plated film 6g (a Pd plated film may be formed between the Au plated film 6e and the Ni plated film 6f) in order from the support plate 1. Since a Cu foil is used for the support plate 1, an Au plated film of a material different from a Cu foil is formed on the side of the plated film 6 facing the support plate 1. In a subsequent step, the support plate 1 formed of a Cu foil is removed by etching while the plated film 6 remains at that time. For this reason, an Au plated film of a material having a different etching rate is formed as an etching stopper on the side of the plated film 6 facing the support plate 1.

Figure 19:
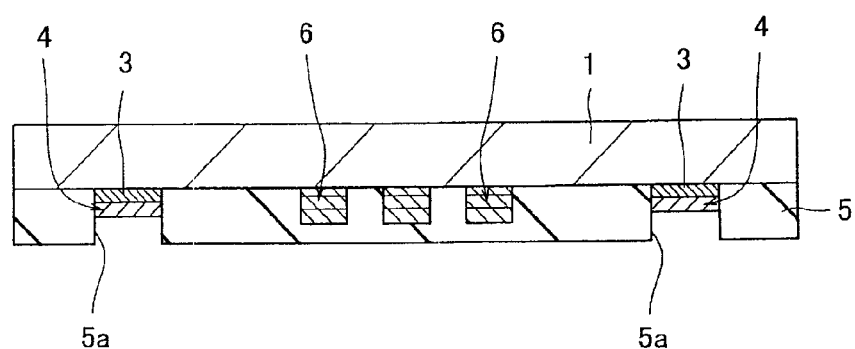
FIG. 19 is a schematic sectional view of the semiconductor package in the manufacturing process subsequent to FIG. 18.

Next, after the resist layer 2 is removed, as shown in FIG. 19, a resist layer 5 having openings 5a is formed on the support plate 1. Next, a depth adjusting film 3 (Ni plated film) of a material different from the support plate 1 (Cu foil) is formed on the support plate 1 at the openings 5a of the resist layer 5 by an electrolytic plating method using the support plate 1 as a plating conduction plate. Next, a plated film 4 (Cu plated film) of a material different from the depth adjusting film 3 is formed on the depth adjusting film 3 at the openings 5a of the resist layer 5 by an electrolytic plating method using the support plate 1 as a plating conduction plate. The plated film 4 is used to form electrode pads, unlike the depth adjusting film 3.

Figure 20:
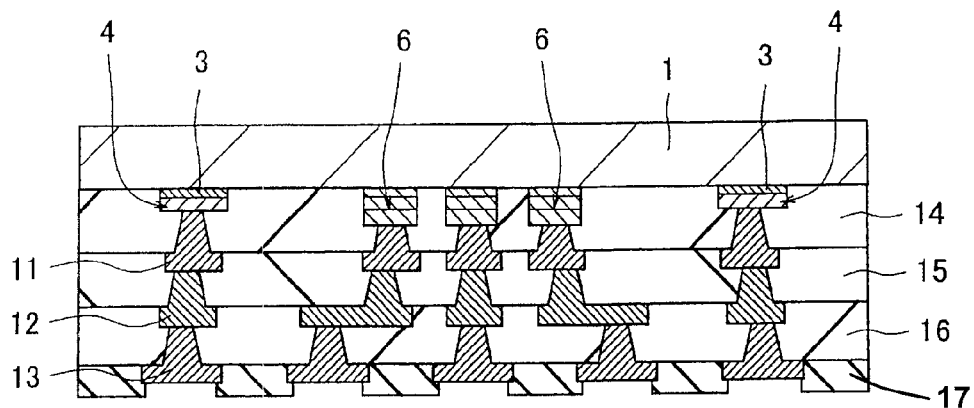
FIG. 20 is a schematic sectional view of the semiconductor package in the manufacturing process subsequent to FIG. 19.

Next, after the resist layer 5 is removed, as shown in FIG. 20, a wiring layer (build-up wiring layer) which includes wiring layers 11, 12, and 13 and insulating interlayers 14, 15, and 16 is formed so as to cover the plated film 4 and the plated film 6.

Figure 21:
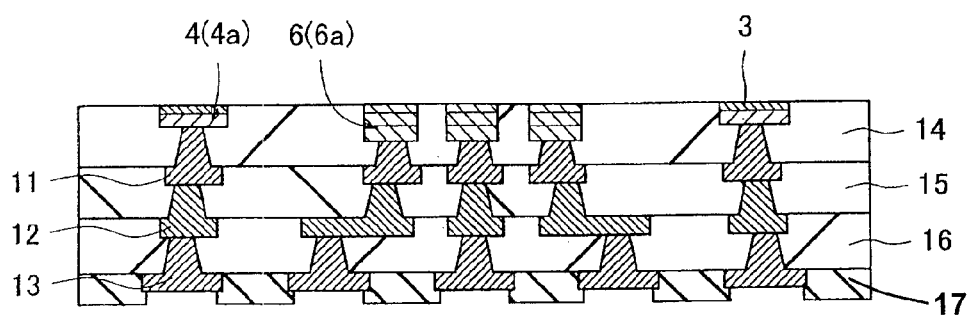
FIG. 21 is a schematic sectional view of the semiconductor package in the manufacturing process subsequent to FIG. 20.

Subsequently, as shown in FIG. 21, the support plate 1 is removed. When the support plate 1 is formed of a Cu foil, for example, the support plate 1 is removed by etching using an etchant containing copper ammonium chloride. At the time of etching using an etchant containing copper ammonium chloride, the insulating interlayer 14 formed of epoxy-based resin or polyimide-based resin is not removed.

An Ni plated film having an etching rate different from a Cu foil forming the support plate 1 is formed as the depth adjusting film 3. For this reason, when the support plate 1 is removed, the depth adjusting film 3 and the plated film 4 remain unremoved. Thus, the surface (exposed surface) of the depth adjusting film 3 is exposed from the insulating interlayer 14.

An Au plated film having an etching rate different from a Cu foil forming the support plate 1 is formed on the side of the plated film 6 facing the support plate 1. For this reason, when the support plate 1 is removed, the plated film 6 remains unremoved. Thus, the surface (exposed surface) of the plated film 6 is exposed from the insulating interlayer 14.

Subsequently, as shown in FIG. 22, the depth adjusting film 3 is removed, such that concave portions 18 are formed on the plated film 4. When an Ni plated film is used for the depth adjusting film 3, for example, the depth adjusting film 3 is removed by etching using an etchant containing nitric acid and hydrogen peroxide solution. An Au plated film having an etching rate different from an Ni plated film forming the depth adjusting film 3 is formed on the exposed side of the plated film 6. Thus, when the depth adjusting film 3 is removed, the plated film 6 remains unremoved. At the time of etching using an etchant containing nitric acid and hydrogen peroxide solution, the insulating interlayer 14 formed of epoxy-based resin or polyimide-based resin is not removed.

The plated film 4 is exposed at the bottom of the concave portions 18 formed in the insulating interlayer 14. The depth of the concave portions 18 (the depth from the surface of the insulating interlayer 14) is the same as the thickness of the depth adjusting film 3. For example, when the thickness of the depth adjusting film 3 is in a range of about 10 μm to about 20 μm, the depth of the concave portions 18 is in a range of about 10 μm to about 20 μm.

In this way, a wiring substrate 20C for a semiconductor package is formed. Electrode pads 6a which are connected to external connection terminals of a semiconductor chip to be mounted are formed in the region A at the central portion of the wiring substrate 20C. Electrode pads 4a which are connected to a connection portion of a lid (heat sink) to be mounted is formed in the region B at the peripheral portion of the wiring substrate 20C in a frame shape so as to surround the region A.

The wiring substrate 20C has the electrode pads 4a formed of the plated film 4 and the electrode pad 6a formed of the plated film 6. The electrode pads 4a and the electrode pads 6a are exposed with different depths from the surface of the insulating interlayer 14. The region B of the wiring substrate 20C is formed in a pocket shape, in which the exposed surfaces of the electrode pads 4a are flush with the bottom of the concave portions 18 formed in the insulating interlayer 14. The region A of the wiring substrate 20C is formed in a flat shape, in which the exposed surfaces of the electrode pads 6a are flush with the surface of the insulating interlayer 14. Different steps can be formed at the surface of the wiring substrate 20C corresponding to portions where the electrode pads 4a and the electrode pads 6a are formed due to the difference in depth between the exposed surfaces of the electrode pads 4a and 6a.

Figure 23:
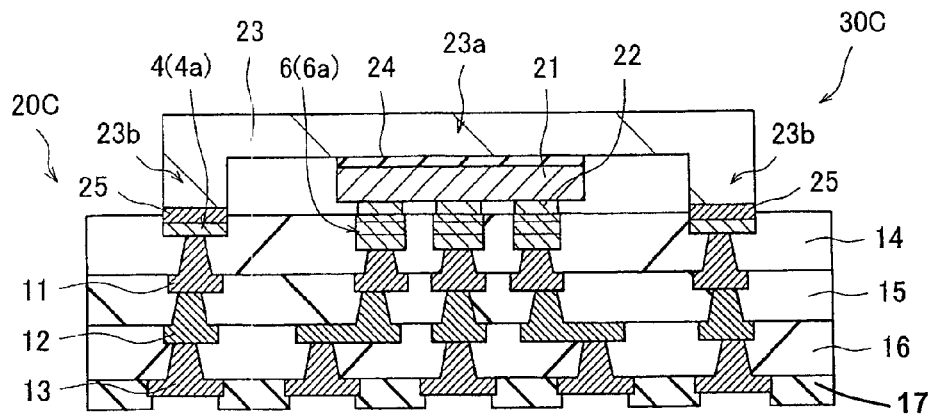
FIG. 23 is a schematic sectional view of the semiconductor package in the manufacturing process subsequent to FIG. 22.

Subsequently, the manufacturing process of the first embodiment described with reference to FIGS. 10 and 11 is carried out, and as shown in FIG. 23, a semiconductor package 30C is formed which has the wiring substrate 20C on which the semiconductor chip 21 and the lid 23 are mounted.

The semiconductor package 30C of this embodiment includes the wiring substrate 20C which has the electrode pads 4a and 6a exposed from the insulating interlayer 14. The electrode pads 4a and 6a are exposed with different depths from the surface of the insulating interlayer 14. Thus, the degree of freedom when various components are mounted on the wiring substrate 20C increases by applying depth control of the mounting surfaces (exposed surfaces) of the electrode pads 4a and 6a in addition to control of the amount of a connection material. Therefore, connection strength of the wiring substrate 20C and various components can be increased, such that the reliability of the semiconductor package 30C can be improved.

Fourth Embodiment

Figure 28:
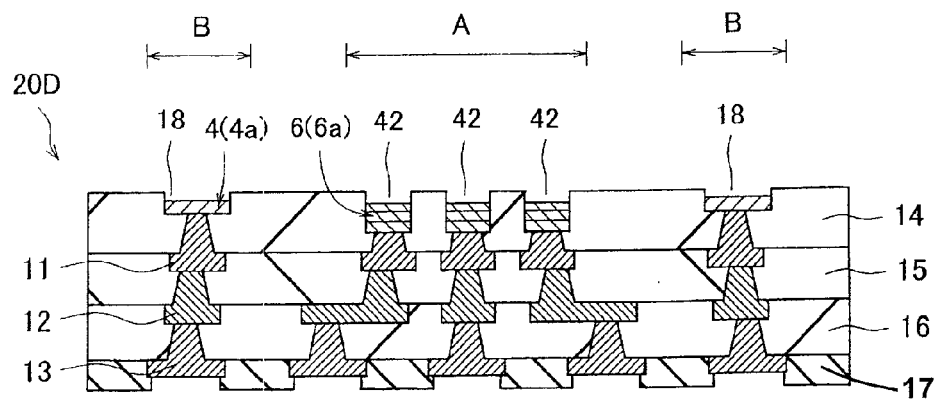
FIG. 28 is a schematic sectional view of the semiconductor package in the manufacturing process subsequent to FIG. 27.

In the first embodiment, as shown in FIG. 9, a case has been described where, in the region A at the central portion of the wiring substrate 20A, the exposed surfaces of the electrode pads 4a are flush with the bottom of the concave portions 18 formed in the insulating interlayer 14, and in the region B at the peripheral portion of the wiring substrate 20A, the exposed surfaces of the electrode pads 6a are flush with the surface of the insulating interlayer 14. In this embodiment, as shown in FIG. 28, a case will be described where, in a region B at the peripheral portion of a wiring substrate 20D, the exposed surfaces of electrode pads 4a are flush with the bottom of concave portions 18 formed in the insulating interlayer 14, and in a region A at the central portion of the wiring substrate 20D, the exposed surfaces of electrode pads 6a are flush with the bottom of concave portions 42 formed in the insulating interlayer 14. Overlapping description between the foregoing embodiments and this embodiment will be omitted hereinafter.

Figure 24:
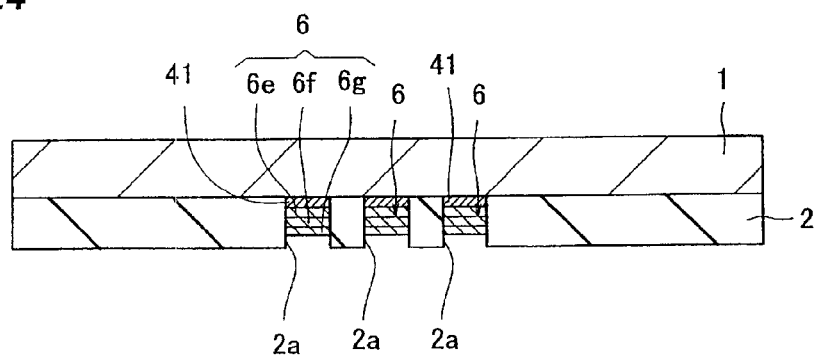
FIG. 24 is a schematic sectional view of a semiconductor package in a manufacturing process according to a fourth embodiment of the invention.

A method of manufacturing a semiconductor package of this embodiment will be described with reference to the drawings. After the manufacturing process of the first embodiment described with reference to FIG. 1, as shown in FIG. 24, a depth adjusting film 41 of the same material as the support plate 1 is formed on the support plate 1 at the openings 2a of the resist layer 2 by an electrolytic plating method using the support plate 1 as a plating conduction plate. The depth adjusting film 41 is, for example, a Cu plated film having a thickness of about 5 μm. In this embodiment, since a Cu foil is used for the support plate 1, a Cu plated film of the same material as a Cu foil is used for the depth adjusting film 41. In a subsequent step, the support plate 1 formed of a Cu foil is removed by etching, and the depth adjusting film 41 is also removed at the time of etching of the support plate 1. For this reason, a Cu plated film of the same material as a Cu foil is used for the depth adjusting film 41.

Next, a plated film 6 of a material different from the depth adjusting film 41 is formed on the depth adjusting film 41 at the openings 2a of the resist layer 2 by an electrolytic plating method using the support plate 1 as a plating conduction plate. The plated film 6 is used to form electrode pads, unlike the depth adjusting film 41.

The plated film 6 may be a single-layered film, but in this embodiment, the plated film 6 is a laminated film of Au plated film 6e/Ni plated film 6f/Cu plated film 6g (a Pd plated film may be formed between the Au plated film 6e and the Ni plated film 6f) in order from the support plate 1. Since a Cu plated film is formed as the depth adjusting film 41, an Au plated film of a material different from a Cu plated film is formed on the side of the plated film 6 facing the support plate 1.

Figure 25:
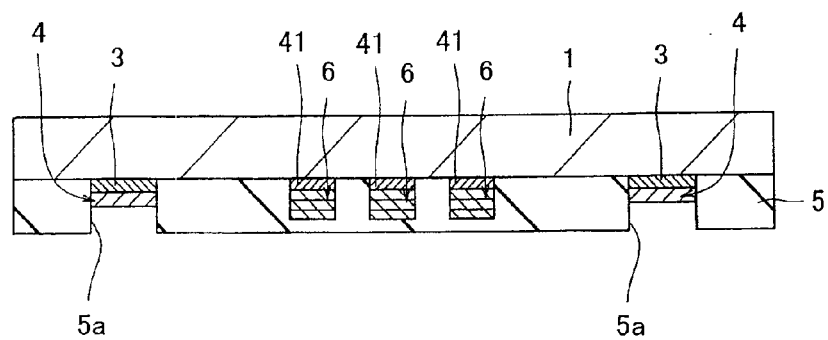
FIG. 25 is a schematic sectional view of the semiconductor package in the manufacturing process subsequent to FIG. 24.

Next, after the resist layer 2 is removed, as shown in FIG. 25, a resist layer 5 having openings 5a is formed on the support plate 1. Next, a depth adjusting film 3 (Ni plated film) of a material different from the support plate 1 (Cu foil) is formed on the support plate 1 at the openings 5a of the resist layer 5 by an electrolytic plating method using the support plate 1 as a plating conduction plate. Next, a plated film 4 (Cu plated film) of a material different from the depth adjusting film 3 is formed on the depth adjusting film 3 at the openings 5a of the resist layer 5 by an electrolytic plating method using the support plate 1 as a plating conduction plate. The plated film 4 is used to form electrode pads, unlike the depth adjusting film 3

Figure 26:
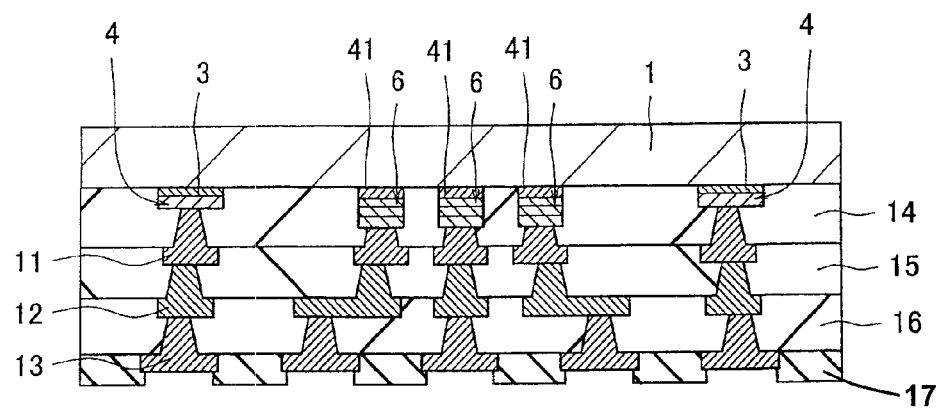
FIG. 26 is a schematic sectional view of the semiconductor package in the manufacturing process subsequent to FIG. 25.

Next, after the resist layer 5 is removed, as shown in FIG. 26, a wiring layer (build-up wiring layer) which includes wiring layers 11, 12, and 13 and insulating interlayers 14, 15, and 16 is formed so as to cover the plated film 4 and the plated film 6.

Figure 27:
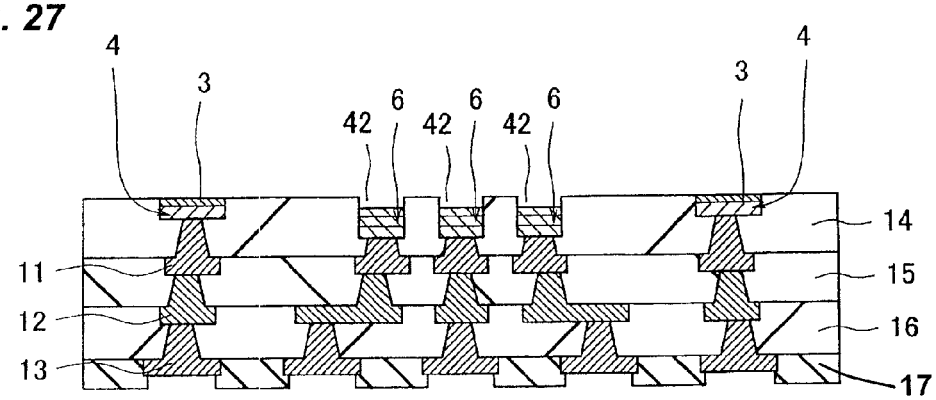
FIG. 27 is a schematic sectional view of the semiconductor package in the manufacturing process subsequent to FIG. 26.

Subsequently, as shown in FIG. 27, the support plate 1 and the depth adjusting film 41 are removed. When a Cu foil is used for the support plate 1 and a Cu plated film is used for the depth adjusting film 41, for example, the support plate 1 and the depth adjusting film 41 are removed by etching using an etchant containing copper ammonium chloride. At the time of etching using an etchant containing copper ammonium chloride, the insulating interlayer 14 formed of epoxy-based resin or polyimide-based resin is not removed.

An Ni plated film having an etching rate different from a Cu foil forming the support plate 1 is formed as the depth adjusting film 3. For this reason, when the support plate 1 is removed, the depth adjusting film 3 and the plated film 4 remain unremoved. Thus, the surface (exposed surface) of the depth adjusting film 3 is exposed from the insulating interlayer 14.

An Au plated film having an etching rate different from a Cu foil forming the support plate 1 and a Cu plated film forming the depth adjusting film 41 is formed on the side of the plated film 6 facing the support plate 1. Thus, when the support plate 1 and the depth adjusting film 41 are removed, the plated film 6 remains unremoved. The depth adjusting film 41 is removed, such that the concave portions 42 are formed on the plated film 6, and the surface (exposed surface) of the plated film 6 is exposed from the insulating interlayer 14.

As described above, the plated film 6 is exposed at the bottom of the concave portions 42 formed in the insulating interlayer 14. The depth of the concave portions 42 (the depth from the surface of the insulating interlayer 14) is the same as the thickness of the depth adjusting film 41. For example, when the thickness of the depth adjusting film 41 is about 5 µm, the depth of the concave portions 42 is about 5 µm.

Subsequently, as shown in FIG. 28, the depth adjusting film 3 is removed, such that concave portions 18 are formed on the plated film 4. When an Ni plated film is used for the depth adjusting film 3, for example, the depth adjusting film 3 is removed by etching using an etchant containing nitric acid and hydrogen peroxide solution. An Au plated film having an etching rate different from an Ni plated film forming the depth adjusting film 3 is formed on the exposed side of the plated film 6. Thus, when the depth adjusting film 3 is removed, the plated film 6 remains unremoved.

As described above, the plated film 4 is exposed at the bottom of the concave portions 18 formed in the insulating interlayer 14. The depth of the concave portions 18 (the depth from the surface of the insulating interlayer 14) is the same as the thickness of the depth adjusting film 3. For example, when the thickness of the depth adjusting film 3 is in a range of about 10 µm to about 20 µm, the depth of the concave portions 18 is in a range of about 10 µm to about 20 µm.

In this way, a wiring substrate 20D for a semiconductor package is formed. Electrode pads 6a which are connected to external connection terminals of a semiconductor chip to be mounted are formed in the region A at the central portion of the wiring substrate 20D. Electrode pads 4a which are connected to a connection portion of a lid (heat sink) to be mounted is formed in the region B at the peripheral portion of the wiring substrate 20D in a frame shape so as to surround the region A.

The wiring substrate 20D has the electrode pads 4a formed of the plated film 4 and the electrode pads 6a formed of the plated film 6. The electrode pads 4a and the electrode pads 6a are exposed with different depths from the surface of the insulating interlayer 14. The region A of the wiring substrate 20D is formed in a pocket shape, in which the exposed surfaces of the electrode pads 6a are flush with the bottom of the concave portions 42 formed in the insulating interlayer 14. The region B of the wiring substrate 20D is formed in a pocket shape, in which the exposed surfaces of the electrode pads 4a are flush with the bottom of the concave portions 18 formed in the insulating interlayer 14. Different steps can be formed at the surface of the wiring substrate 20D corresponding to portions where the electrode pads 4a and the electrode pads 6a are formed due to the difference in depth between the exposed surfaces of the electrode pads 4a and 6a.

Figure 29:
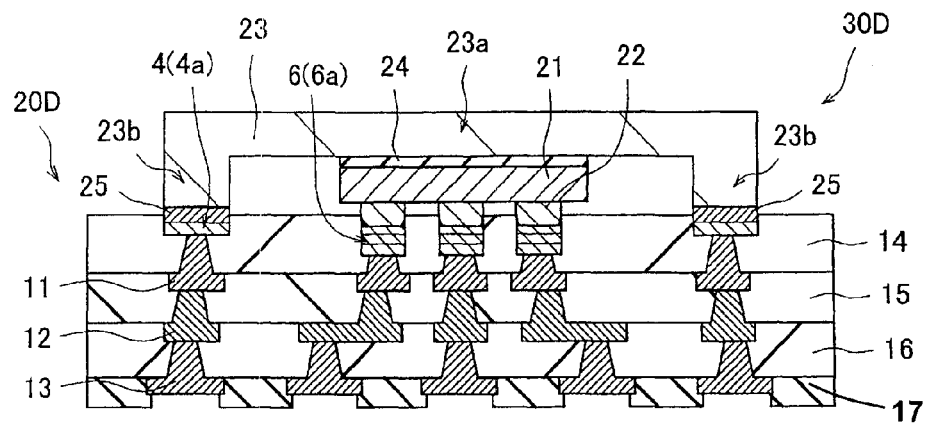
FIG. 29 is a schematic sectional view of the semiconductor package in the manufacturing process subsequent to FIG. 28.

Subsequently, the manufacturing process of the first embodiment described with reference to FIGS. 10 and 11 is carried out, such that, as shown in FIG. 29, a semiconductor package 30D is formed which has the wiring substrate 20D on which the semiconductor chip 21 and the lid 23 are mounted.

The semiconductor package 30D of this embodiment includes the wiring substrate 20D which has the electrode pads 4a and 6a exposed from the insulating interlayer 14. The electrode pads 4a and 6a are exposed with different depths from the surface of the insulating interlayer 14. Thus, the degree of freedom when various components are mounted on the wiring substrate 20D increases by applying depth control of the mounting surfaces (exposed surfaces) of the electrode pads 4a and 6a in addition to control of the amount of a connection material. Therefore, connection strength of the wiring substrate 20D and various components can be increased, such that the reliability of the semiconductor package 30D can be improved.

Fifth Embodiment

Figure 34:
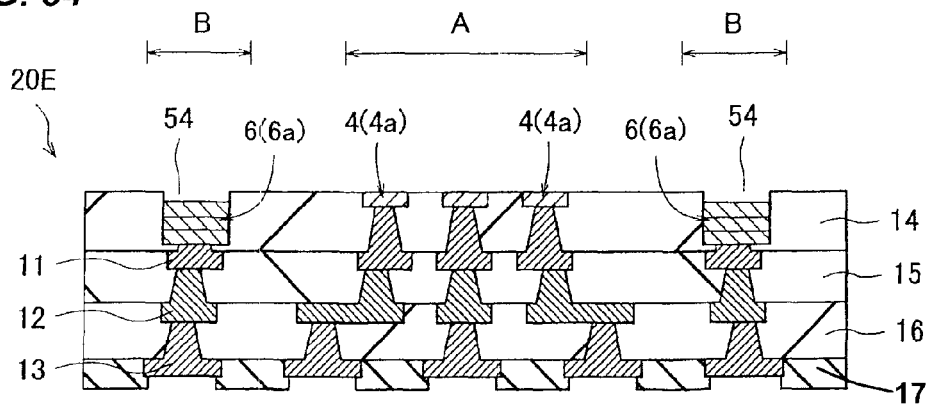
FIG. 34 is a schematic sectional view of the semiconductor package in the manufacturing process subsequent to FIG. 33.

In the first embodiment, as shown in FIG. 9, a case has been described where, in the region A at the central portion of the wiring substrate 20A, the exposed surfaces of the electrode pads 4a are flush with the bottom of the concave portions 18 formed in the insulating interlayer 14, and in the region at the peripheral portion of the wiring substrate 20A, the exposed surfaces of the electrode pads 6a are flush with the surface of the insulating interlayer 14. In this embodiment, as shown in FIG. 34, a case will be described where, in a region B at the peripheral portion of a wiring substrate 20E, the exposed surfaces of electrode pads 6a are flush with the bottom of concave portions 54 formed in the insulating interlayer 14, and in a region A at the central portion of the wiring substrate 20E, the exposed surfaces of electrode pads 4a are flush with the surface of the insulating interlayer 14. Overlapping description between the foregoing embodiments and this embodiment will be omitted herein.

Figure 30:
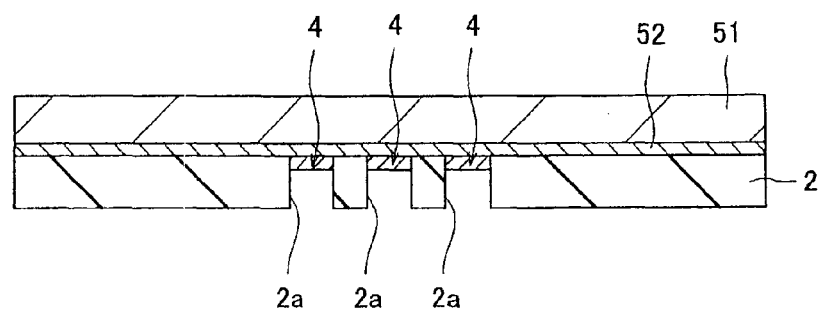
FIG. 30 is a schematic sectional view of a semiconductor package in a manufacturing process according to a fifth embodiment of the invention.

A method of manufacturing a semiconductor package of this embodiment will be described with reference to the drawings. First, as shown in FIG. 30, a conductive support plate 51 is prepared, and a feeding layer 52 is formed on one surface of the support plate 51 by an electrolytic plating method using the support plate 51 as a plating conduction plate. The support plate 51 is, for example, a Cu foil having a thickness of about 500 μm. The feeding layer 52 is, for example, an Ni plated film having a thickness of about 5 μm.

Next, a resist layer 2 having openings 2a is formed on the feeding layer 52. The resist layer 2 is formed of, for example, dry film resist or liquid resist having a predetermined thickness. For example, the resist layer 2 having the openings 2a therein is formed on the feeding layer 52 by forming dry film resist on the feeding layer 52 and carrying out exposure and development for the dry film resist.

Next, a plated film 4 of a material different from the feeding layer 52 is formed on the feeding layer 52 at the openings 2a of the resist layer 2 by an electrolytic plating method using the support plate 51 and the feeding layer 52 as a plating conduction plate. The plated film 4 is used to form electrode pads.

The plated film 4 is, for example, a Cu plated film having a thickness of about 10 μm to about 20 μm. In this embodiment, since an Ni plated film is formed as the feeding layer 52, the plated film 4 is formed of a Cu plated film different from an Ni plated film. In a subsequent step, the feeding layer 52 formed of an Ni plated film is removed by etching while the plated film 4 remains at that time. For this reason, a Cu plated film having an etching rate different from an Ni plated film is formed as the plated film 4.

Figure 31:
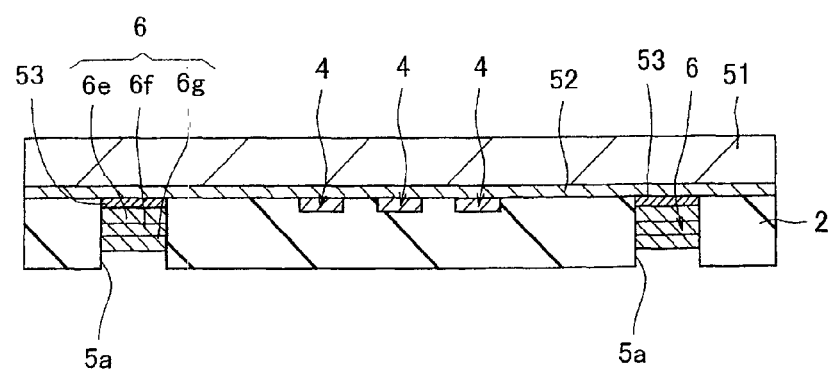
FIG. 31 is a schematic sectional view of the semiconductor package in the manufacturing process subsequent to FIG. 30.

Next, after the resist layer 2 is removed, as shown in FIG. 31, a resist layer 5 having openings 5a is formed on the feeding layer 52. Next, a depth adjusting film 53 of the same material as the feeding layer 52 is formed on the feeding layer 52 at the openings 5a of the resist layer 5 by an electrolytic plating method using the support plate 51 and the feeding layer 52 as a plating conduction plate. Next, a plated film 6 of a material different from the depth adjusting film 53 is formed on the depth adjusting film 53 at the openings 5a of the resist layer 5 by an electrolytic plating method using the support plate 51 and the feeding layer 52 as a plating conduction plate. The plated film 6 is used to form electrode pads.

The plated film 6 may be a single-layered film, but in this embodiment, the plated film 6 is a laminated film of Au plated film 6e/Ni plated film 6f/Cu plated film 6g (a Pd plated film may be formed between the Au plated film 6e and the Ni plated film 6f) in order from the depth adjusting film 53. Since an Ni plated film is formed as the depth adjusting film 53, an Au plated film of a material different from an Ni plated film is formed on the side of the plated film 6 facing the feeding layer 52.

Figure 32:
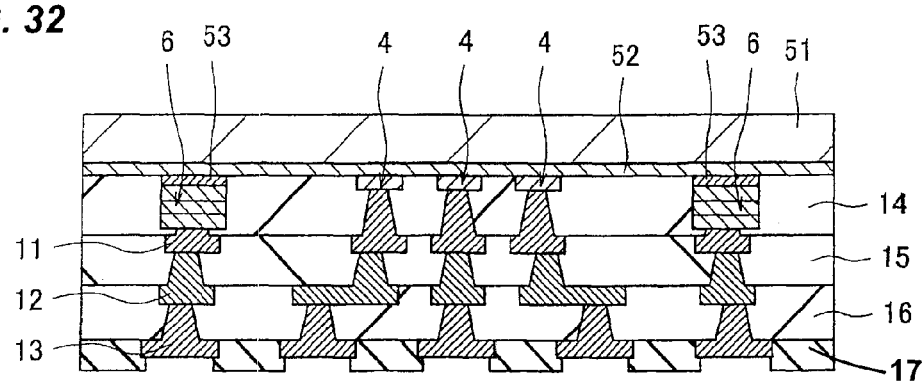
FIG. 32 is a schematic sectional view of the semiconductor package in the manufacturing process subsequent to FIG. 31.

Next, after the resist layer 5 is removed, as shown in FIG. 32, a wiring layer (build-up wiring layer) which includes wiring layers 11, 12, and 13 and insulating interlayers 14, 15, and 16 is formed so as to cover the plated film 4 and the plated film 6.

Figure 33:
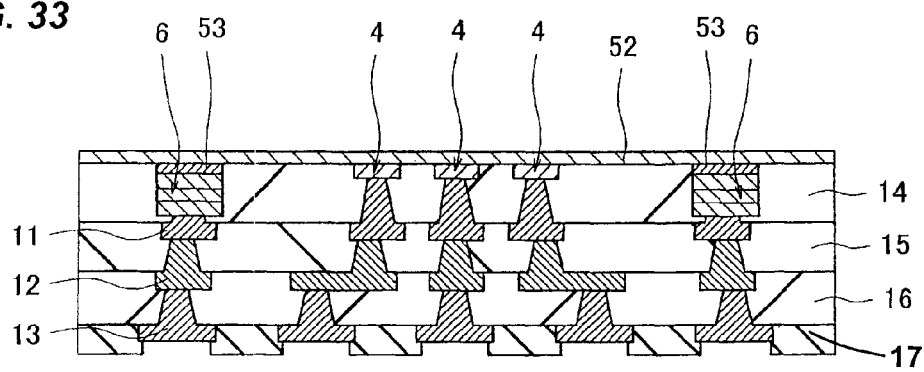
FIG. 33 is a schematic sectional view of the semiconductor package in the manufacturing process subsequent to FIG. 32.

Subsequently, as shown in FIG. 33, the support plate 51 is removed. When a Cu foil is used for the support plate 51, for example, the support plate 51 is removed by etching using an etchant containing copper ammonium chloride. An Ni plated film having an etching rate different from a Cu foil forming the support plate 51 is formed as the feeding layer 52. For this reason, when the support plate 51 is removed, the feeding layer 52 remains unremoved.

Subsequently, as shown in FIG. 34, the feeding layer 52 and the depth adjusting film 53 are removed. When an Ni plated film is used for the feeding layer 52 and the depth adjusting film 53, for example, the feeding layer 52 and the depth adjusting film 53 are removed by etching using an etchant containing nitric acid and hydrogen peroxide solution. At the time of etching, the insulating interlayer 14 formed of epoxy-based resin or polyimide-based resin is not removed.

A Cu plated film having an etching rate different from an Ni plated film forming the feeding layer 52 is formed as the plated film 4. For this reason, when the feeding layer 52 is removed, the plated film 4 remains unremoved. Thus, the surface (exposed surface) of the plated film 4 is exposed from the insulating interlayer 14.

An Au plated film having an etching rate different from Ni plated films forming the feeding layer 52 and the depth adjusting film 53 is formed on the side of the plated film 6 facing the feeding layer 52. For this reason, when the feeding layer 52 and the depth adjusting film 53 are removed, the plated film 6 remains unremoved. The depth adjusting film 53 is removed, such that concave portions 54 are formed on the plated film 6, and the surface (exposed surface) of the plated film 6 is exposed from the insulating interlayer 14.

The plated film 6 is exposed at the bottom of the concave portions 54 formed in the insulating interlayer 14. The depth of the concave portions 54 (the depth from the surface of the insulating interlayer 14) is the same as the thickness of the depth adjusting film 53. For example, when the thickness of the depth adjusting film 53 is about 10 μm, the depth of the concave portions 54 is about 10 μm.

In this way, a wiring substrate 20E for a semiconductor package is formed. Electrode pads 4a which are connected to external connection terminals of a semiconductor chip to be mounted are formed in the region A at the central portion of the wiring substrate 20E. Electrode pads 6a which are connected to a connection portion of a lid (heat sink) to be mounted are formed in the region B at the peripheral portion of the wiring substrate 20E in a frame shape so as to surround the region A.

The wiring substrate 20E has the electrode pads 4a formed of the plated film 4 and the electrode pads 6a formed of the plated film 6. The electrode pads 4a and the electrode pads 6a are exposed with different depths from the surface of the insulating interlayer 14. The region B of the wiring substrate 20E is formed in a pocket shape, in which the exposed surfaces of the electrode pads 6a are flush with the bottom of the concave portions 54 formed in the insulating interlayer 14. The region A of the wiring substrate 20E is formed in a flat shape, in which the exposed surfaces of the electrode pads 4a are flush with the surface of the insulating interlayer 14. Different steps can be formed at the surface of the wiring substrate 20E corresponding to portions where the electrode pads 4a and the electrode pads 6a are formed due to the difference in depth between the exposed surfaces of the electrode pads 4a and 6a.

Figure 35:
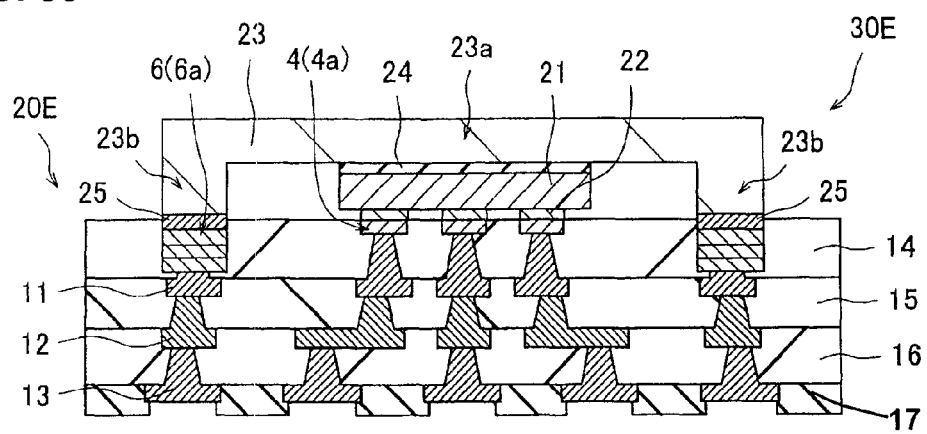
FIG. 35 is a schematic sectional view of the semiconductor package in the manufacturing process subsequent to FIG. 34.

Subsequently, the manufacturing process of the first embodiment described with reference to FIGS. 10 and 11 is carried out, such that, as shown in FIG. 35, a semiconductor package 30E is formed which has the wiring substrate 20E on which the semiconductor chip 21 and the lid 23 are mounted.

The semiconductor package 30E of this embodiment includes the wiring substrate 20E which has the electrode pads 4a and 6a exposed from the insulating interlayer 14. The electrode pads 4a and 6a are exposed with different depths from the surface of the insulating interlayer 14. Thus, the degree of freedom when various components are mounted on the wiring substrate 20E increases by applying depth control of the mounting surfaces (exposed surfaces) of the electrode pads 4a and 6a in addition to control of the amount of a connection material. Therefore, connection strength of the wiring substrate 20E and various components can be increased, such that the reliability of the semiconductor package 30E can be improved.

Although in this embodiment, a case where a Cu foil is used for the support plate 51 and an Ni plated film is used for the feeding layer 52 has been described, an Ni foil may be used for the support plate 51. In this case, if the support plate 51 formed of an Ni foil, the feeding layer 52 formed of an Ni plated film, and the depth adjusting film 53 formed of an Ni plated film are removed, for example, by etching using an etchant containing nitric acid and hydrogen peroxide solution, the state shown in FIG. 34 is obtained. When an Ni foil is used for the support plate 51, the feeding layer 52 of an Ni plated film may not be formed.

Sixth Embodiment

Figure 40:
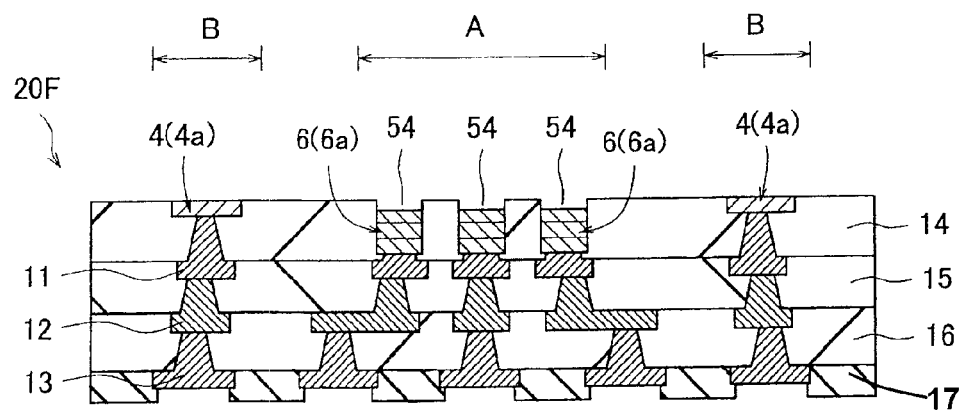
FIG. 40 is a schematic sectional view of the semiconductor package in the manufacturing process subsequent to FIG. 39.

In the first embodiment, as shown in FIG. 9, a case has been described where, in the region A at the central portion of the wiring substrate 20A, the exposed surfaces of the electrode pads 4a are flush with the bottom of the concave portions 18 formed in the insulating interlayer 14, and in the region at the peripheral portion of the wiring substrate 20A, the exposed surfaces of the electrode pads 6a are flush with the surface of the insulating interlayer 14. In this embodiment, as shown in FIG. 40, a case will be described where, in a region at the central portion of a wiring substrate 20F, the exposed surfaces of electrode pads 6a are flush with the bottom of concave portions 54 formed in the insulating interlayer 14, and in a region B at the peripheral portion of the wiring substrate 20F, the exposed surfaces of electrode pads 4a are flush with the surface of the insulating interlayer 14. Overlapping description between the foregoing embodiment and this embodiment will be omitted.

Figure 36:
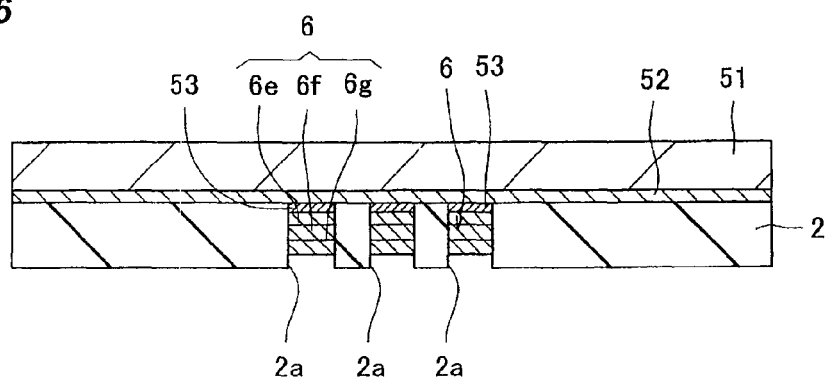
FIG. 36 is a schematic sectional view of a semiconductor package in a manufacturing process according to a sixth embodiment of the invention.

A method of manufacturing a semiconductor package of this embodiment will be described with reference to the drawings. First, as shown in FIG. 36, a conductive support plate 51 is prepared, and a feeding layer 52 is formed on one surface of the support plate 51 by an electrolytic plating method using the support plate 51 as a plating conduction plate. The support plate 51 is, for example, a Cu foil having a thickness of about 500 μm. The feeding layer 52 is, for example, an Ni plated film having a thickness of about 5 μm.

Next, a resist layer 2 having openings 2a is formed on the feeding layer 52. The resist layer 2 is formed of for example, dry film resist or liquid resist having a predetermined thickness. For example, the resist layer 2 having the openings 2a is formed on the feeding layer 52 by forming dry film resist on the feeding layer 52 and carrying out exposure and development for the dry film resist.

Next, a depth adjusting film 53 of the same material as the feeding layer 52 is formed on the feeding layer 52 at the openings 2a of the resist layer 2 by an electrolytic plating method using the support plate 51 and the feeding layer 52. Next, a plated film 6 of a material different from the depth adjusting film 53 is formed on the depth adjusting film 53 at the openings 2a of the resist layer 2 by an electrolytic plating method using the support plate 51 and the feeding layer 52 as a plating conduction plate. The plated film 6 is used to form electrode pads.

The plated film 6 may be a single-layered film, but in this embodiment, the plated film 6 is a laminated film of Au plated film 6e/Ni plated film 6f/Cu plated film 6g (a Pd plated film may be formed between the Au plated film 6e and the Ni plated film 6f) in order from the depth adjusting film 53. Since an Ni plated film is formed as the depth adjusting film 53, an Au plated film of a material different from an Ni plated film is formed on the side of the plated film 6 facing the feeding layer 52.

Figure 37:
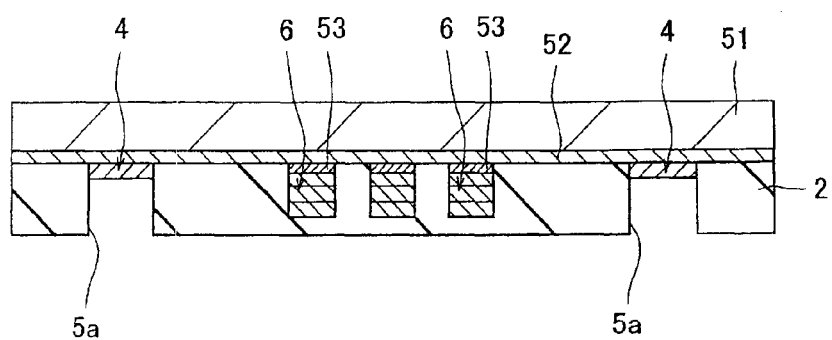
FIG. 37 is a schematic sectional view of the semiconductor package in the manufacturing process subsequent to FIG. 36.

Next, after the resist layer 2 is removed, as shown in FIG. 37, a resist layer 5 having openings 5a is formed on the feeding layer 52. Next, a plated film 4 of a material different from the feeding layer 52 is formed on the feeding layer 52 at the openings 5a of the resist layer 5 by an electrolytic plating method using the support plate 51 and the feeding layer 52 as a plating conduction plate. The plated film 4 is used to form electrode pads.

The plated film 4 is, for example, a Cu plated film having a thickness of about 10 μm to about 20 μm. In this embodiment, since an Ni plated film is formed as the feeding layer 52, the plated film 4 is formed of a Cu plated film of a material different from an Ni plated film. In a subsequent step, the feeding layer 52 formed of an Ni plated film is removed by etching while the plated film 4 remains at that time. For this reason, a Cu plated film having an etching rate different from an Ni plated film is formed as the plated film 4.

Figure 38:
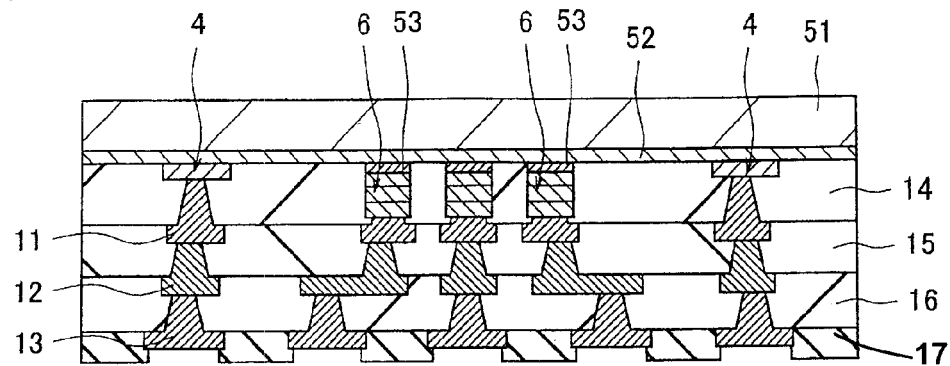
FIG. 38 is a schematic sectional view of the semiconductor package in the manufacturing process subsequent to FIG. 37.

Next, after the resist layer 5 is removed, as shown in FIG. 38, a wiring layer (build-up wiring layer) which includes wiring layers 11, 12, and 13 and insulating interlayers 14, 15, and 16 is formed so as to cover the plated film 4 and the plated film 6.

Figure 39:
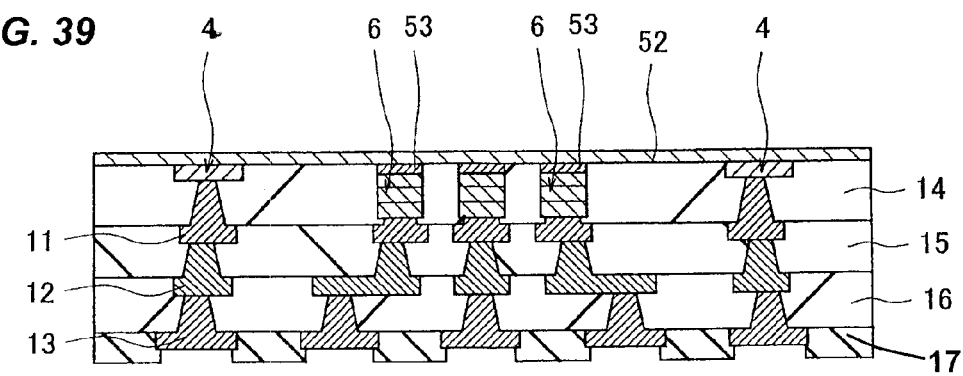
FIG. 39 is a schematic sectional view of the semiconductor package in the manufacturing process subsequent to FIG. 38.

Subsequently, as shown in FIG. 39, the support plate 51 is removed. When a Cu foil is used for the support plate 51, for example, the support plate 51 is removed by etching using an etchant containing copper ammonium chloride. An Ni plated film having an etching rate different from a Cu foil forming the support plate 51 is formed as the feeding layer 52. For this reason, when the support plate 51 is removed, the feeding layer 52 remains unremoved.

Subsequently, as shown in FIG. 40, the feeding layer 52 and the depth adjusting film 53 are removed. When an Ni plated film is used for the feeding layer 52 and the depth adjusting film 53, for example, the feeding layer 52 and the depth adjusting film 53 are removed by etching using an etchant containing nitric acid and hydrogen peroxide solution. At the time of etching, the insulating interlayer 14 formed of epoxy-based resin or polyimide-based resin is not removed.

A Cu plated film having an etching rate different from an Ni plated film forming the feeding layer 52 is formed as the plated film 4. For this reason, when the feeding layer 52 is removed, the plated film 4 remains unremoved. Thus, the surface (exposed surface) of the plated film 4 is exposed from the insulating interlayer 14.

An Au plated film having an etching rate different from Ni plated films forming the feeding layer 52 and the depth adjusting film 53 is formed on the side of the plated film 6 facing the feeding layer 52. For this reason, when the feeding layer 52 and the depth adjusting film 53 are removed, the plated film 6 remains unremoved. The depth adjusting film 53 is removed, such that concave portions 54 are formed on the plated film 6, and the surface (exposed surface) of the plated film 6 is exposed from the insulating interlayer 14.

The plated film 6 is exposed at the bottom of the concave portions 54 formed in the insulating interlayer 14. The depth of the concave portions 54 (the depth from the surface of the insulating interlayer 14) is the same as the thickness of the depth adjusting film 53. For example, when the thickness of the depth adjusting film 53 is about 10 μm, the depth of the concave portions 54 is about 10 μm.

In this way, a wiring substrate 20F for a semiconductor package is formed. Electrode pads 6a which are connected to external connection terminals of a semiconductor chip to be mounted are formed in the region A at the central portion of the wiring substrate 20F. Electrode pads 4a which are connected to a connection portion of a lid (heat sink) to be mounted is formed in the region B at the peripheral portion of the wiring substrate 20F in a frame shape so as to surround the region A.

The wiring substrate 20F has the electrode pads 4a formed of the plated film 4 and the electrode pads 6a formed of the plated film 6. The electrode pads 4a and the electrode pads 6a are exposed with different depths from the surface of the insulating interlayer 14. The region A of the wiring substrate 20F is formed in a pocket shape, in which the exposed surfaces of the electrode pacts 6a are flush with the bottom of the concave portions 54 formed in the insulating interlayer 14. The region B of the wiring substrate 20F is formed in a flat shape, in which the exposed surfaces of the electrode pads 4a are flush with the surface of the insulating interlayer 14. Different steps can be formed at the surface of the wiring substrate 20F corresponding to portions where the electrode pads 4a and the electrode pads 6a are formed due to the difference in depth between the exposed surfaces of the electrode pacts 4a and 6a.

Figure 41:
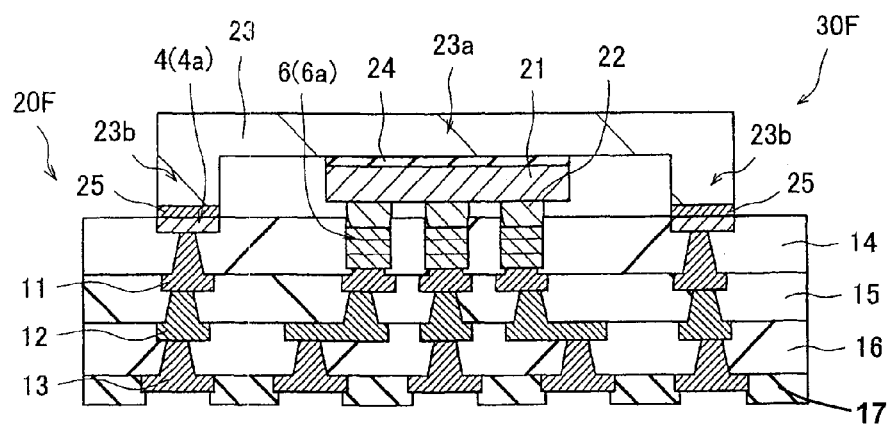
FIG. 41 is a schematic sectional view of the semiconductor package in the manufacturing process subsequent to FIG. 40.

Subsequently, the manufacturing process of the first embodiment described with reference to FIGS. 10 and 11 is carried out, such that, as shown in FIG. 41, a semiconductor package 30F is formed which has the wiring substrate 20F on which the semiconductor chip 21 and the lid 23 are mounted.

The semiconductor package 30F of this embodiment includes the wiring substrate 20F which has the electrode pads 4a and 6a exposed from the insulating interlayer 14. The electrode pads 4a and 6a are exposed with different depths from the surface of the insulating interlayer 14. Thus, the degree of freedom when various components are mounted on the wiring substrate 20F increases by applying depth control of the mounting surfaces (exposed surfaces) of the electrode pads 4a and 6a in addition to control of the amount of a connection material. Therefore, connection strength of the wiring substrate 20F and various components can be increased, such that the reliability of the semiconductor package 30F can be improved.

Seventh Embodiment

Figure 42:
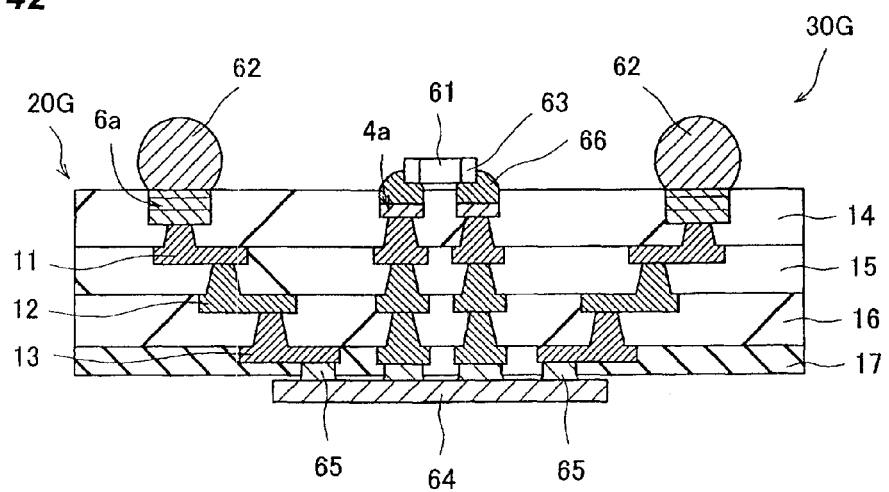
FIG. 42 is a schematic sectional view of a semiconductor package according to a seventh embodiment of the invention.

In the first embodiment, as shown in FIG. 11, a case has been described where various components (the semiconductor chip 21 and the lid 23) are mounted on the surface of the wiring substrate 20A at which the electrode pads 4a and 6a are formed. In this embodiment, as shown in FIG. 42, a case will be described where various components (a chip capacitor 61 and solder balls 62) are mounted on a surface of a wiring substrate 20G at which electrodes 4a and 6a are formed, and a semiconductor chip 64 is mounted on the opposite surface of the wiring substrate 20G. Overlapping description between the foregoing embodiments and this embodiment will be omitted herein.

The wiring substrate 20G of this embodiment can be formed by the manufacturing process of the first embodiment described with reference to FIGS. 1 to 9. Through this manufacturing process, the electrode pads 4a and the electrode pads 6a of the wiring substrate 20G are exposed with different depths from the surface of a surface insulating layer 14. Wiring layers 13 exposed from the surface of solder resist 17 are formed as electrode pads at a surface (hereinafter, referred to as a second surface) opposite to a surface (hereinafter, referred to as a first surface) at which the electrode pads 4a and 6a are formed.

As shown in FIG. 42, a chip capacitor 61 is mounted on the first surface of the wiring substrate 20G. The chip capacitor 61 has external connection terminals 63. The external connection terminals 63 and the electrode pads 4a of the wiring substrate 20G are electrically connected to each other through solders 66, such that the chip capacitor 61 is mounted on the wiring substrate 20G.

Solder balls 62 which are external connection terminals of the wiring substrate 20G are mounted on the first surface of the wiring substrate 20G. The solder balls 62 and the electrode pads 6a of the wiring substrate 20G are electrically connected to each other, such that the solder balls 62 are mounted on the wiring substrate 20G.

A semiconductor chip 64 is mounted on the second surface of the wiring substrate 20G. External connection terminals 65, such as gold bumps or solder bumps, which are electrically connected to an internal element, are formed at the main surface (element forming surface) of the semiconductor chip 64. The external connection terminals 65 and electrode pads (wiring layers 13) of the wiring substrate 20G are electrically connected to each other, such that the semiconductor chip 64 is flip-chip mounted on the wiring substrate 20G.

In this way, a semiconductor package 30G is formed which has the wiring substrate 20G on which the semiconductor chip 64, the chip capacitor 61, and the solder balls 62 are mounted. Although in the first embodiment, the semiconductor chip 21 is mounted on the surface at which the electrode pads 4a and 6a are formed (see FIG. 11), in this embodiment, other components (the chip capacitor 61 and the solder balls 62), instead of the semiconductor chip 64, are mounted on the surface (first surface) at which the electrode pads 4a and 6a are formed.

In the wiring substrate 20G of this embodiment, the electrode pads 4a and 6a are exposed with different depths from the surface of the insulating interlayer 14. For this reason, the degree of freedom in terms of capacity for mounting various components (the chip capacitor 61 and the solder balls 62) on the wiring substrate 20G can increase. In addition to the chip capacitor 61, other electrical components, such as a chip resistor, may be mounted. Instead of the wiring substrate 20G, the wiring substrate having the structure described in any one of the first to sixth embodiments may be used.

Eighth Embodiment

In the first embodiment, as shown in FIG. 11, a case has been described where the semiconductor chip 21 and the lid 23 are mounted on the surface of the wiring substrate 20A at which the electrode pads 4a and 6a are formed. In this embodiment, a case where additional parts (chip capacitors 61 and a semiconductor chip 21) are mounted will be described. Overlapping description between the foregoing embodiments and this embodiment will be omitted herein.

Figure 43:
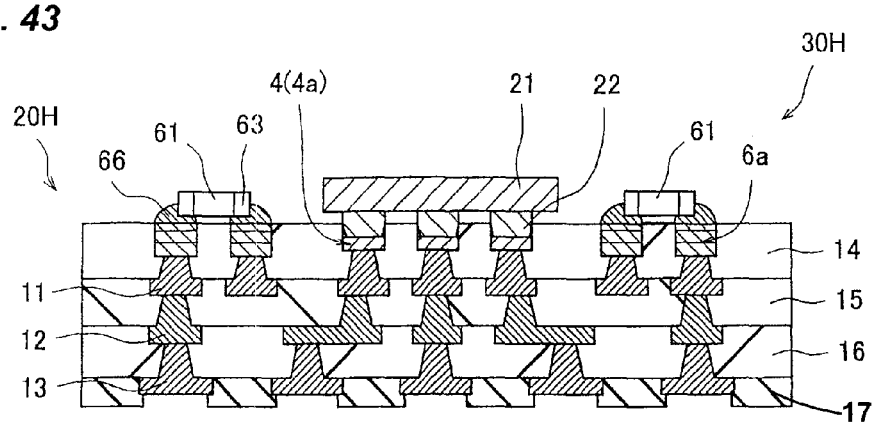
FIG. 43 is a schematic sectional view of a semiconductor package according to an eighth embodiment of the invention.

A wiring substrate 20H shown in FIG. 43 can be formed by the manufacturing process of the first embodiment described with reference to FIGS. 1 to 9. Through this manufacturing process, the electrode pads 4a and the electrode pads 6a of the wiring substrate 20H are exposed with different depths from the surface of a surface insulating layer 14. The electrode pads 4a of the wiring substrate 20H and the external connection terminals 22 of the semiconductor chip 21 are electrically connected to each other, such that the semiconductor chip 21 is mounted on the wiring substrate 20H. The electrode pads 6a of the wiring substrate 20H and the external connection terminals 63 of the respective chip capacitors 61 are electrically connected to each other through solders 66, such that the chip capacitors 61 are mounted on the wiring substrate 20H.

In this way, a semiconductor package 30H is formed which has the wiring substrate 20H on which the semiconductor chip 21 and the chip capacitors 61 are mounted. In the wiring substrate 20H of this embodiment, the electrode pads 4a and 6a are exposed with different depths from the surface of the insulating interlayer 14. For this reason, the degree of freedom in terms of capacity for mounting various components on the wiring substrate 20H can increase. In addition to the chip capacitors 61, other electrical components, such as a chip resistor, may be mounted. Instead of the wiring substrate 20H, the wiring substrate having the structure described in any one of the first to sixth embodiments may be used.

Ninth Embodiment

Figure 44:
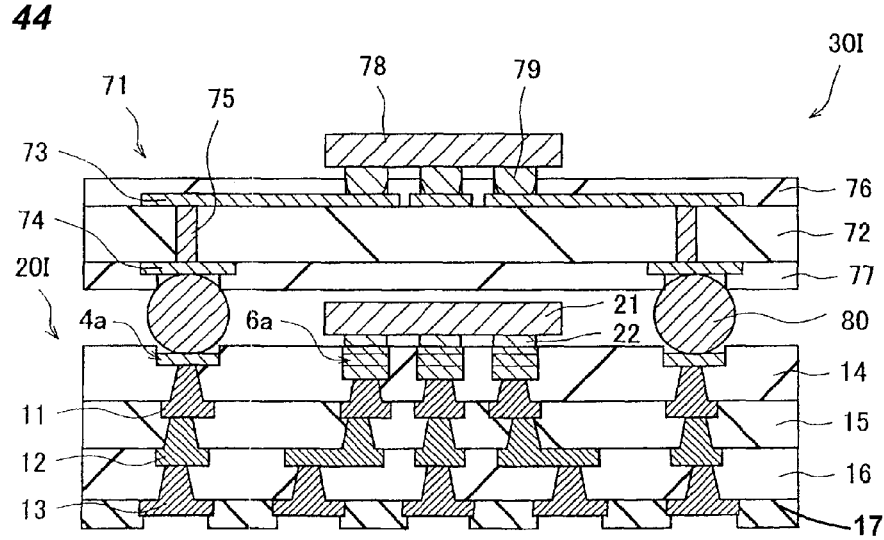
FIG. 44 is a schematic sectional view of a semiconductor package according to a ninth embodiment of the invention.

A wiring substrate 20I shown in FIG. 44 can be formed by the manufacturing process of the third embodiment with reference to FIGS. 18 to 22. Through this manufacturing process, the electrode pads 4a and the electrode pads 6a of the wiring substrate 20I are exposed with different depths from the surface of a surface insulating layer 14. The electrode pads 6a of the wiring substrate 20I and the external connection terminals 22 of the semiconductor chip 21 are electrically connected to each other, such that the semiconductor chip 21 is mounted on the wiring substrate 20I. The electrode pads 4a of the wiring substrate 20I and external connection terminals 80 (solder balls) of a POP (Package On Package) substrate 71 are electrically connected to each other, such that the POP substrate 71 is mounted on the wiring substrate 20I.

The POP substrate 71 is, for example, a wiring substrate which has wiring layers 73 and 74 formed on both surfaces of a core substrate 72, through holes 75 provided to pass through the core substrate 72 and to electrically connect the wiring layers 73 and 74, and solder resists 76 and 77 formed on the core substrate 72 so as to cover the wiring layers 73 and 74. A semiconductor chip 78 is mounted on the POP substrate 71, and external connection terminals 79 of the semiconductor chip 78 are electrically connected to the wiring layers 73 exposed from the solder resist 76. External connection terminals 80 of the POP substrate 71 are formed on a surface opposite to the surface on which the semiconductor chip 78 is mounted.

In this way, a semiconductor package 30I is formed which has the wiring substrate 20I on which the semiconductor chip 21 and the POP substrate 71 are mounted. In the wiring substrate 20I of this embodiment, the electrode pads 4a and 6a are exposed with different depths from the surface of the insulating interlayer 14. For this reason, the degree of freedom in terms of capacity for mounting various components on the wiring substrate 20I can increase. Instead of the wiring substrate 20I, the wiring substrate having the structure described in any one of the first to sixth embodiments may be used.

For example, although in the first embodiment, a case has been described where after the electrode pads 4a (plated film 4) are formed, the electrode pads 6a (plated film 6) are formed, either of the electrode pads 4a and 6a may be formed first. Similarly, in the second to ninth embodiments, either of the electrode pads 4a and 6a may be formed first.

For example, although in the first embodiment, as shown in FIG. 12, a case has been described where the electrode pads 4a have a circular planar shape, and the electrode pads 6a have a flame-shaped planar shape, various shapes, such as a circular shape or a rectangular shape (for mounting a semiconductor chip or a chip capacitor), a frame shape (for mounting a cover), may be used according to various components to be mounted. The same is applied to the second to ninth embodiments.

As the plated films exposed at the outermost layers of the electrode pads 4a and 6a, in addition to a Cu plated film or an Au plated film, various metals, such as an Sn (tin) plated film or a solder plated film, such as Sn—Pb (lead), may be used.

While the present invention has been shown and described with reference to certain exemplary embodiments thereof, other implementations are within the scope of the claims. It will be understood by those skilled in the art that various changes in form and details may be made therein without departing from the spirit and scope of the invention as defined by the appended claims.

What is claimed is:

1. A wiring substrate comprising:
an insulating layer having an insulating layer surface which defines an outer surface of the wiring substrate, the insulating layer surface defining a surface of the wiring substrate;
first electrode pads embedded in the insulating layer, each of the first electrode pads having a first exposed surface and a first opposite surface opposite to the first exposed surface, the first exposed surfaces being exposed from the insulating layer at the insulating layer surface, the first electrode pads configured to have a chip mounted on the first exposed surfaces, each of the first electrode pads is provided within a different first electrode pad opening defined in the insulating layer, and all of the first exposed surfaces are recessed relative to the insulating layer surface;
an electrode seal ring embedded in the insulating layer, the electrode seal ring having a second exposed surface and a second opposite surface opposite to the second exposed surface, the second exposed surface being exposed from the insulating layer at the insulating layer surface, the electrode seal ring having a frame shape and surrounding the first electrode pads, the electrode seal ring provided within a frame-shaped electrode seal ring opening defined in the insulating layer, the second exposed surface is flush with the insulating layer surface, and the electrode seal ring configured to have a lid bonded to the second exposed surface;
first vias provided in the insulating layer, each of the first vias connected to a corresponding one of the first opposite surfaces of the first electrode pads; and
a second via provided in the insulating layer, the second via connected to the second opposite surface of the electrode seal ring,
wherein there is a level difference between the first exposed surfaces and the second exposed surface relative to the insulating layer surface, a width of each first exposed surface is less than a width of the second exposed surface, and a width of each first electrode pad opening at the insulating layer surface is less than a width of the electrode seal ring opening at the insulating layer surface.

2. The wiring substrate according to claim 1, wherein each of the first exposed surfaces and each first electrode pad opening have equal widths at the insulating layer surface.

3. The wiring substrate according to claim 1, wherein a material of the first exposed surfaces is different from that of the second exposed surface.

4. A semiconductor package comprising:
the wiring substrate according to claim 1;
a semiconductor chip having external connection terminals thereon and being mounted on the wiring substrate, wherein the external connection terminals are electrically connected to the first electrode pads; and
a lid mounted on the wiring substrate and being electrically connected to the electrode seal ring.

5. The wiring substrate according to claim 1, wherein each of the first electrode pads has a first height measured between the first exposed surface and the first opposite surface, the electrode seal ring has a second height measured between the second exposed surface and the second opposite surface, and the second height is greater than the first height.

6. The wiring substrate according to claim 1, wherein each of the first opposite surfaces are provided at an equal depth relative to the insulating layer surface, and the depth of the first opposite surfaces relative to the insulating layer surface is less than a depth of the second opposite surface relative to the surface of the insulating layer.

7. The wiring substrate according to claim 1, wherein the electrode seal ring encircles the first electrode pads along the insulating layer surface.

8. The wiring substrate according to claim 1, wherein all of the first exposed surfaces are on a same level relative to the insulating layer surface.

9. The wiring substrate according to claim 1, wherein the insulating layer surface includes a chip mounting region and an outer region disposed entirely outside of and surrounding the chip mounting region, the first electrode pads are disposed only in the chip mounting region, and the electrode seal ring is disposed only in the outer region.

\* \* \* \* \*